(12) United States Patent
Wei et al.

(10) Patent No.: US 11,586,075 B2
(45) Date of Patent: Feb. 21, 2023

(54) PHOTOPATTERNING OF MOLECULAR ORIENTATIONS

(71) Applicant: Kent State University, Kent, OH (US)

(72) Inventors: Qi-Huo Wei, Hudson, OH (US); Hao Yu, Kent, OH (US); Yubing Guo, Kent, OH (US); Miao Jiang, Kent, OH (US); Oleg D. Lavrentovich, Kent, OH (US)

(73) Assignee: KENT STATE UNIVERSITY, Kent, OH (US)

( * ) Notice: Subject to any disclaimer, the term of this patent is extended or adjusted under 35 U.S.C. 154(b) by 0 days.

(21) Appl. No.: 16/484,218

(22) PCT Filed: Feb. 7, 2018

(86) PCT No.: PCT/US2018/017149
§ 371 (c)(1),
(2) Date: Aug. 7, 2019

(87) PCT Pub. No.: WO2018/148229
PCT Pub. Date: Aug. 16, 2018

(65) Prior Publication Data
US 2019/0377213 A1    Dec. 12, 2019

Related U.S. Application Data

(60) Provisional application No. 62/455,732, filed on Feb. 7, 2017.

(51) Int. Cl.
*G02F 1/1337* (2006.01)
*B82Y 20/00* (2011.01)
(Continued)

(52) U.S. Cl.
CPC .......... *G02F 1/13378* (2013.01); *B82Y 20/00* (2013.01); *B82Y 40/00* (2013.01); *C09K 19/56* (2013.01); *G02F 1/1523* (2013.01)

(58) Field of Classification Search
CPC .......................... G02F 1/13378; G02F 1/1523
See application file for complete search history.

(56) References Cited

U.S. PATENT DOCUMENTS 8,767,282 B2    7/2014  Hashimura et al.
8,895,213 B2 *  11/2014 Shin .......................... G03F 1/00
                                                         430/5

(Continued)

FOREIGN PATENT DOCUMENTS

WO    2017027444    2/2017

OTHER PUBLICATIONS

Seungwa Baek et al., "Resolution enhancement using plasmonic metamask for wafer-scale photolithography in the far field", Scientific Reports, pp. 1-8 (Jul. 26, 2016) (Year: 2016).*

(Continued)

*Primary Examiner* — Dung T Nguyen
(74) *Attorney, Agent, or Firm* — Lippes Mathias LLP

(57) ABSTRACT

A method for aligning molecular orientations of liquid crystals and/or polymeric materials into spatially variant patterns uses metamasks. When non-polarized or circularly polarized light is transmitted through or reflected by the metamasks, spatially varied polarization direction and intensity patterns of light can be generated. By projecting the optical patterns of the metamasks onto substrates coated with photoalignment materials, spatially variant molecular orientations encoded in the polarization and intensity patterns are induced in the photoalignment materials, and transfer into the liquid crystals. Possible designs for the metamask use nanostructures of metallic materials (e.g., rectangular nanocuboids of metallic materials arrayed on a transparent substrate).

17 Claims, 24 Drawing Sheets

(51) Int. Cl.
   *B82Y 40/00*      (2011.01)
   *C09K 19/56*      (2006.01)
   *G02F 1/1523*     (2019.01)

(56) References Cited

U.S. PATENT DOCUMENTS

| | | | |
|---|---|---|---|
| 2002/0085144 A1* | 7/2002 | Liu | G02F 1/1337 349/65 |
| 2006/0044500 A1* | 3/2006 | Nakagawa | H01L 51/0012 349/123 |
| 2010/0225864 A1* | 9/2010 | Inoue | G02F 1/133788 349/123 |
| 2013/0003033 A1* | 1/2013 | Lee | G03F 7/2022 355/67 |
| 2013/0075778 A1 | 3/2013 | Nakanish et al. | |
| 2018/0231846 A1* | 8/2018 | Wei | G02F 1/1303 |
| 2020/0409165 A1* | 12/2020 | Tam | H01S 5/423 |

OTHER PUBLICATIONS

US Search Authority, International Search Report and Written Opinion in corresponding PCT Application No. PCT/US2018/017149 (dated May 8, 2018).

Guo et al., "Designs of Plasmonic Metamasks for Photopatterning Molecular Orientations in Liquid Crystals", Crystals, vol. 7, issue 1, pp. 1-11 (Jan. 2017).

Guo et al., "High-Resolution and High-Throughput Plasmonic Photopatterning of Complex Molecular Orientations in Liquid Crystals", Advanced Materials, vol. 28, issue 12, pp. 2353-2358 (Mar. 2016).

\* cited by examiner (a) (b) (c)

Fabricated Mask with Horizontal Polarizer

Fabricated Mask with Vertical Polarizer

Mask Design for ½ Defect Pair

Fabricated Mask without Polarizer

PHOTOPATTERNING OF MOLECULAR ORIENTATIONS

This application is a National Stage Entry of International Application No. PCT/US2018/017149, filed Feb. 7, 2018, which claims priority to U.S. Provisional Application Ser. No. 62/455,732, filed Feb. 7, 2017. The contents of both of these applications are incorporated by reference herein in their entireties.

This invention was made with United States Government support under grant/contract numbers CMMI-1436565 and DMR-1507637, awarded by the National Science Foundation. The United States Government has certain rights in the invention.

BACKGROUND

The present disclosure relates to methods for aligning liquid crystal molecules.

Liquid crystal materials exhibit properties between those of conventional liquids and solids. In particular, liquid crystal molecules tend to point along a common axis, called the director. In contrast, molecules in the liquid phase exhibit little or no intrinsic order and solid phase molecules exhibit little or no translational freedom.

Liquid crystal materials are widely used in various devices and applications. Typically, a liquid crystal device (e.g., a liquid crystal display) includes electrodes that form an electric field upon receiving a voltage, and a layer or layers of liquid crystal materials that are controlled by the electric field. More specifically, the dielectric anisotropy of the liquid crystal molecules makes it possible to change the orientation of the liquid crystal molecules by controlling the electric field.

Controlling molecular orientations is important to the functionalities of liquid crystal and polymeric materials and devices (e.g., gratings, tunable lenses, liquid crystal displays, stimuli-responsive liquid crystal sensors, and actuators). Thus, there is a large demand for systems and methods for aligning liquid crystal molecules in spatially varying director fields for various device manufacturing processes.

Capabilities to define spatially variant molecular orientations are needed to enable new materials and devices. Well-designed molecular orientations are needed for functional liquid crystal devices such as tunable Pancharatnam prisms and gratings, q-plates, and liquid crystalline light emitting diodes. With pre-designed director fields, the stimulus-responsive deformations of liquid crystal elastomers can be preprogrammed, enabling a variety of origami-inspired metamaterials and devices. Freedom in defining director fields also allows for engineering the nonlinear electrokinetic flows in liquid crystals that are currently obtained through the director fields induced by embedded colloidal particles. Molecular director fields can also serve as templates for directing colloidal assembly. While surface alignment of liquid crystal molecules has been a topic of extensive studies, only a few techniques allow for designer, non-uniform director fields. One relies on nano-grooves created by rubbing polymer films with atomic force microscope tips or by photolithography. The other is through pixel-by-pixel direct laser writing or based on a dynamic mask exposure of photoalignment materials. These techniques are based on serial fabrication processes and thus face limitations when high resolution and scalability are considered for large-scale micro-device manufacturing.

The technique of this disclosure overcomes the limitations of these prior techniques and makes photopatterning of molecular orientations a repeatable and scalable process for manufacturing. Regarding scalability, the concepts, systems, and methods of the present disclosure may be compatible with commercial stepper systems, low cost (limitless use), and repeatable (single mask).

A traditional photomask is a plate with transparent and opaque areas. Shining light through the photomask generates intensity patterns. The photomasks are commonly used in photolithography, where the light intensity is primarily used to cause photochemical reactions in photoactive materials.

BRIEF DESCRIPTION

The metamasks of the present disclosure are a new concept of photomasks which generate not only patterns of light intensity but also patterns of polarization directions. These polarization patterns may be used to align molecular orientations in photoactive materials.

The present disclosure relates to systems and methods for aligning liquid crystal molecules with desired patterns of molecular orientations.

Disclosed in some embodiments is a method for aligning liquid crystals. The method includes transmitting light through or reflecting light by a metamask and projecting the light onto a sample substrate, wherein the metamask generates light with spatially variant patterns of polarization direction and intensity. The metamask comprises an array of metallic nanocuboids (e.g., rectangular nanocuboids) on a metamask substrate. The metamask substrate is transparent to light of predetermined wavelengths.

In some embodiments, the liquid crystals are in contact with photoalignment materials during the transmitting and/or after the transmitting.

The metamask may be a plasmonic metamask.

In some embodiments, the light transmitted through or reflected by the metamask has patterns of spatial variations in intensity and polarization direction.

The metallic nanocuboids may include a metallic material selected from the group consisting of elemental aluminum, an aluminum alloy, elemental copper, a copper alloy, elemental gold, a gold alloy, elemental silver, or a silver alloy.

In some embodiments, the metallic nanocuboids are arranged in a lattice, such as a triangular lattice.

The lattice may have a periodicity of from about 100 to about 500 nm.

In some embodiments, the metallic nanocuboids are arranged with spatially varying orientations.

A photoalignment layer may be present on a top surface of the substrate during the exposure.

In some embodiments, the sample substrate further comprises a photoalignment material mixed with the liquid crystals.

The metamask may be located at a distance of from about 0 to about 50 times a wavelength of light provided to the metamask.

In some embodiments, a lens or multiple lenses is/are positioned between the metamask and the photoalignment layer for projecting the metamask patterns onto the substrate.

Two objective lenses may be positioned between the metamask and the photoalignment layer for projecting the metamask patterns onto the substrate.

Disclosed in other embodiments is an oriented substrate produced by the above-described process.

Disclosed in further embodiments is a system for aligning liquid crystals including a light source and a metamask.

Disclosed in other embodiments is a plasmonic metamask comprising an array of metallic nanocuboids on a metamask substrate; wherein the metamask substrate is transparent to light of predetermined wavelengths.

In some embodiments, the metallic nanocuboids include a metallic material selected from the group consisting of elemental aluminum, an aluminum alloy, elemental copper, a copper alloy, elemental gold, a gold alloy, elemental silver, or a silver alloy.

The metallic nanocuboids may be arranged in a lattice, such as a triangular lattice.

In some embodiments, the metallic nanocuboids are arranged with spatially varying orientations.

The nanocuboids may be parallelepipeds.

In some embodiments, the nanocuboids are rectangular parallelepipeds.

The nanocuboids may be cubic.

These and other non-limiting characteristics are more particularly described below and in the appended materials.

BRIEF DESCRIPTION OF THE DRAWINGS

The following is a brief description of the drawings, which are presented for the purposes of illustrating the exemplary embodiments disclosed herein and not for the purposes of limiting the same.

FIG. 1a is an expanded view of a building unit made with an anisotropic aperture (such as a rectangular aperture) in a metal film. FIG. 1b is an expanded view of a building unit made with wire-grid polarizers such as parallel nanoslits. FIG. 1c is an expanded view of a building unit made with nanoparticles (such as nanorods or nanocuboids). The building unit may have different shapes, including squares as shown here, triangles as in FIG. 4, hexagons, or other shapes that can fill the plane, or the building units are arranged in different lattices such as square, triangular, hexagonal, or other lattices.

DETAILED DESCRIPTION

Figure 1:
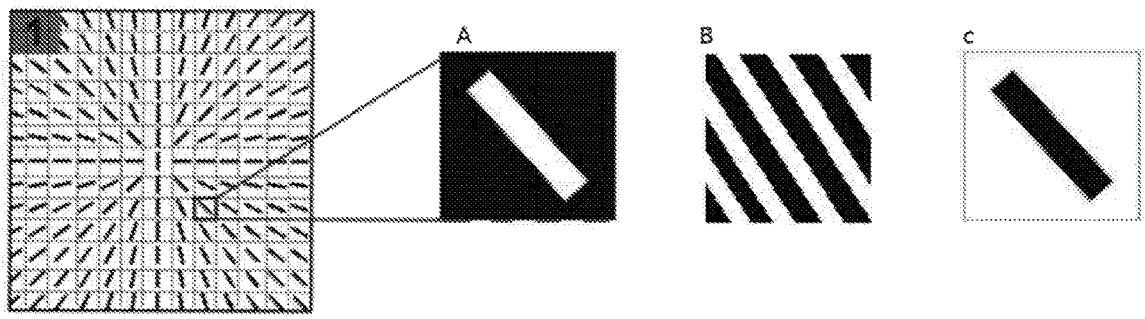
FIG. 1 illustrates metamasks for creating light with spatially variant patterns of polarization directions and intensity in accordance with some embodiments of the present disclosure.

The present disclosure may be understood more readily by reference to the following detailed description of desired embodiments included therein and the appended article, supplementary materials, and presentation slides. In the following specification and the claims which follow, reference will be made to a number of terms which shall be defined to have the following meanings.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent can be used in practice or testing of the present disclosure. All publications, patent applications, patents, and other references mentioned herein are incorporated by reference in their entirety. The materials, methods, and articles disclosed herein are illustrative only and not intended to be limiting.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases that require the presence of the named ingredients/steps and permit the presence of other ingredients/steps. However, such description should be construed as also describing compositions, mixtures, or processes as "consisting of" and "consisting essentially of" the enumerated ingredients/steps, which allows the presence of only the named ingredients/steps, along with any impurities that might result therefrom, and excludes other ingredients/steps.

Unless indicated to the contrary, the numerical values in the specification should be understood to include numerical values which are the same when reduced to the same number of significant figures and numerical values which differ from the stated value by less than the experimental error of the conventional measurement technique of the type used to determine the particular value.

All ranges disclosed herein are inclusive of the recited endpoint and independently combinable (for example, the range of "from 2 to 10" is inclusive of the endpoints, 2 and 10, and all the intermediate values). The endpoints of the ranges and any values disclosed herein are not limited to the precise range or value; they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

As used herein, the term "nanocuboid" includes parallelepipeds with at least one nano (i.e., sub-micron) dimension. In some embodiments, all of the dimensions of the nanocuboid are nano dimensions. The parallelepipeds may be rectangular parallelpipeds. In some embodiments, the rectangular parallelepipeds are cubes.

Light from a light source is provided to illuminate a metamask (e.g., a plasmonic metamask). The metamask is configured to generate spatially variant patterns for polarization and/or intensity. This light with spatially varying polarization direction is projected (e.g., transmitted or reflected) onto a substrate containing a material to be aligned. The substrate is coated with a photoalignment layer comprising one or more photoalignment materials. Molecular director fields encoded in the polarization patterns can be imprinted on the substrate. The concepts, systems, and methods described herein may be useful for high-resolution (e.g., <0.5 μm) and high-throughput processing (e.g., single exposure <1 second).

The metamasks may include metallic nanostructures, and are named plasmonic metamasks in this case. In some embodiments, the plasmonic metamask comprises aluminum, an aluminum alloy, silver, a silver alloy, gold, a gold alloy, copper, a copper alloy, and/or other materials (e.g., high refractive index materials).

In some embodiments, the metamask includes nanostructure of dielectric materials. Non-limiting examples of such dielectric materials include aluminum nitride and hafnium oxide. The aluminum nitride and/or other materials may be provided on a substrate. The substrate may be transparent or substantially transparent for working wavelengths (e.g., ultraviolet or visible wavelengths). The substrate may comprise quartz, fused quartz, $SiO_2$, and/or normal glass.

In some embodiments, a band of wavelengths of light are used. Non-limiting examples of wavelength bands include from about 300 nm to about 400 nm and from about 400 nm to about 600 nm.

In some embodiments, the metamasks take advantage of the anisotropic optical response of metallic nanostructures. The anisotropic nanostructures reflect and transmit light differently for different polarization directions and yield polarization contrasts in the transmitted and/or reflected light. Non-limiting examples of metal materials include silver, gold, aluminum, copper, and alloys of one or more thereof optionally with one or more other elements.

The anisotropic nanostructures may be anisotropic apertures in metal films, as illustrated in FIG. 1a. The apertures may be rectangular or elliptical in shape. The apertures may have stronger optical transmission for the polarization direction along the short axis than along the long axis of the apertures. The apertures may be arranged in periodic or non-periodic positions. The orientations of the apertures can be arranged in spatially variant patterns from aperture to aperture, or from pixel to pixel. An individual pixel may consist of parallel nanoapertures with their orientation set by a required polarization pattern for each pixel. Polarization may be perpendicular to the long axis of the apertures.

In some embodiments, the nanoapertures are rectangular and parallel to each other.

In some embodiments, the metal sheet has a thickness in the range of from about 50 nm to about 500 nm, including from about 100 nm to about 300 nm and from about 125 nm to about 200 nm.

The nanoapertures may have a short axis width of from about 40 to about 200 nm, including from about 50 to about 150 nm, from about 75 to about 125 nm, and about 100 nm.

The nanoapertures may have a long axis length of from about 100 to about 400 nm, including from about 150 to about 290 nm, from about 170 to about 270 nm, and from about 200 to about 240 nm and about 220 nm. In some embodiments, the nanoapertures are rectangles having dimensions of about 100 nm×about 220 nm.

The nanoapertures may be arranged in a triangular lattice. In some embodiments, the lattice has a periodicity of from about 100 to about 500 nm, including from about 200 to about 400 nm, from about 250 to about 350 nm, from about 275 to about 325 nm, and about 270 nm or about 300 nm.

The anisotropic nanostructures may alternatively be nanoscale slits in metal films, which are also called wire grid polarizers when the metal wire width is comparable with the slit width, as illustrated in FIG. 1. The slit width may be smaller than the wavelength(s) of light used, and the transmission of light through the nanoslits may be stronger for light polarization perpendicular to the slits than along the slits.

To generate spatially variant polarization patterns, an area of the parallel nanoslits can be used as individual units (or pixels), and placed to fill the plane. The orientations of the slits in individual units (or pixels) can be varied spatially to yield required polarization patterns. An example is illustrated in FIG. 1 for polarization with +1 defect. A plane is divided into individual building units (or pixels) of rectangles or other shapes. In each unit (or pixel), the parallel nanoslits are oriented in a direction as required by the polarization pattern for photoalignment.

The apertures may be provided in arrays with spatially variant orientations. The metamasks create spatially variant polarization patterns in the transmitted or reflected light. By projecting the transmitted or reflected light onto substrates of liquid crystal cells coated with photoalignment materials, molecular director fields encoded in the polarization patterns (i.e., the nanoaperture orientations) can be imprinted on these substrates and then imposed onto the bulk of the liquid crystal cells.

The nanoaperture arrays may have optical transmissions approaching 50% (e.g., from 30 to 50%, from 40 to 50%, from 35 to 48%, and from 40 to 45%).

Another way to generate spatially variant polarization patterns is to use anisotropic nanoparticles. Non-limiting examples of such nanoparticles include nanorods and nano-elliptic disks. For nanorods, there are two base resonant modes. One can be excited by light with polarization along the long axis and the other can be excited by light with polarization along the short axis. These two modes are resonant at two different wavelengths. The resonant wavelengths depend on the particle sizes and dielectric constants of the substrates. For nanoparticles with their major axis parallel, the optical transmission will depend on polarization directions.

When the nanoparticles on substrates are illuminated with non-polarized light and wavelengths close to the resonant wavelengths of two major modes, the transmitted or reflected light will be mostly polarized along one major axis of the nanoparticles. To generate complex polarization patterns, the plane can be split into individual areas (i.e., pixels). Each pixel can be filled with nanoparticles whose major axes are parallel. The nanoparticle orientations can be varied from pixel to pixel so that the polarization of light transmitted through the mask will be spatially variant.

Aluminum has a small skin depth ($\delta$~14 nm) and a large surface plasmon propagation length (~3 μm).

Non-limiting examples of photoalignment materials include azo-dyes and/or photopolymerization photoalignment materials.

In some embodiments, the photoalignment material comprises brilliant yellow (Sigma Aldrich) and/or PAAD-72 (BeamCo). These materials have absorption bands between about 400 nm and about 550 nm.

Non-limiting examples of azo-dyes include PAAD-22 (from Beamco), PAAD-27 (from Beamco), methyl red, methyl orange, SD1: 4,4'-bis(4-hydroxy-3-carboxy-phenylazo)benzidine-2,2'-disulphonic acid, and 6Az10: 1,1-[4-[(4'hexylphenyl)azo]-phenoxy]undecanoic acid.

When azo-dyes are utilized, the azo-molecules and liquid crystal molecules may be aligned with their long molecular axis perpendicular to the polarization direction of illuminating light.

Non-limiting examples of photopolymerization photoalignment materials include cinnamate, coumarin, tetrahydrophthalimide, maleimide, chalconyl, anthracenyl containing polymers, and methacrylamidoaryl methacrylates.

In some cases, such as when photopolymerization-based photoalignment materials are used, the liquid crystal may be aligned with their long molecular axis parallel to the polarization direction of the illuminating light.

The liquid crystals may be nematic liquid crystals, smectic liquid crystals, cholesteric liquid crystals, and/or lyotropic chromonic liquid crystal materials.

In some embodiments, the nematic liquid crystal material includes one or more of E7 (EM Industries), 4-cyano-4'-pentylbiphenyl (5CB), MLC7026 (EM Industries), a mixture of E7 and MLC7026, a mixture of 5CB and CCN47 (Nematel GmbH), CB7CB [1",7"-bis(4-cyanobiphenyl-4'-yl)heptane], and/or C7 [4,4'(1,3,4-oxadiazole-2,5-diyl) di-p-heptylbenzoate].

In some embodiments, the smectic liquid crystal material includes one or more of 8CB [4'-n-octyl-4-cyano-biphenyl] and 8OCB [octyloxybiphenyl].

In some embodiments, the cholesteric liquid crystal material includes one or more of nematic E7 doped with chiral dopant S811 [(S)-octan-2-yl 4-((4-(hexyloxy)benzoyl)oxy) benzoate] and R811 [(R)-octan-2-yl 4-((4-(hexyloxy)benzoyl)oxy)benzoate] and Nematic MLC7026 doped with chiral dopant S811 and R811.

In some embodiments, the lyotropic chromonic liquid crystal material includes one or more of disodium cromoglycate (DSCG) and sunset yellow (SSY) (e.g., in a limited period of time).

Wavelengths of light incident upon the metamasks may be determined by the absorption spectra of the photoalignment materials. In some embodiments, the wavelengths are in the range of from about 300 nm to about 550 nm. Minor adjustments may be made to the metamask designs to fit the working wavelength(s).

In some embodiments, the liquid crystal substrate has a thickness of from about a few micrometers to a few millimeters, including from about 100 micrometers to about 3 millimeters. The photopatterning technique and the projection system may work for different thicknesses.

The photoalignment layer may be a self-assembled monolayer.

In some embodiments, the photoalignment layer has a thickness of from about 0.5 nm to about 100 nm, including from about 1 nm to about 50 nm, from about 1 to about 10 nm, from about 2 nm to about 8 nm, and from about 3 nm to about 7 nm.

In contrast to existing systems and methods using dynamic masks like digital micromirror devices, the alignment systems and methods of the present disclosure do not have limitations of pixel numbers and may only require single exposure. These advantages permit high throughputs and make the presently disclosed systems and methods particularly suitable for large scale manufacturing.

The systems and methods of the present disclosure may be used in a variety of applications including, but not limited to, tunable liquid crystal lenses, filters, gratings, stimuli-responsive liquid crystal devices, displays, light-emitting diodes, and photovoltaics.

The technology can be used for patterned pixel displays that would greatly improve the viewing angle performance for liquid crystal displays. If a display pixel has a uniform direction of alignment (produced by a traditional rubbing or photoalignment), the viewing angle performance is different when the observation direction changes from left to top to right to bottom view. One approach to eliminate the problem is to have the pixel divided into 2, 4 (or more) subpixels with different alignment directions. The disclosed technology is particularly suitable for such an approach as the patterned photoalignment can be achieved quickly and over a large area.

The photoalignments (e.g., plasmonic photoalignments) are advantageous in at least several respects. For example, because the polarization patterns are included in the mask designs, the single exposure or parallel fabrication process makes the throughput very high. Additionally, the photopatterning is scalable for large-scale manufacturing. By adapting step-repeat exposures, patterns with areas larger than the metamask size can be patterned. Furthermore, the transmissive metamasks function similarly as the reticles in the commercial projection photolithography systems, and thus can be directly implemented in auto steppers for wafer size manufacturing. Additionally, the systems and methods can be used for visible (e.g., G-line 436 nm) exposure or UV (e.g., I-line 365 nm) exposure. The designs of the metamasks may be slightly modified depending on the particular exposure application.

Figure 2:
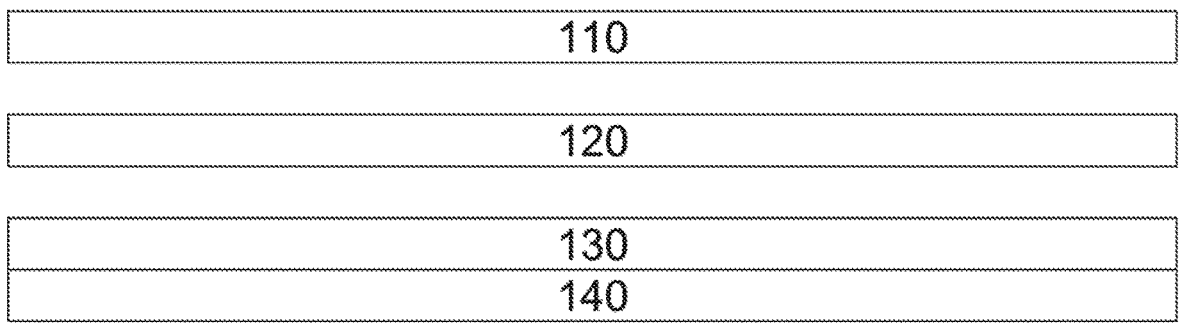
FIG. 2 is a schematic diagram illustrating a proximity photopatterning system in accordance with some embodiments of the present disclosure.

Photopatterning may be accomplished via either projection photopatterning or proximity photopatterning. A non-limiting example of a proximity photopatterning system is shown in schematic FIG. 2. The system 100 includes a light source 110, metamask 120, photoalignment material 130, and substrate 140. The distance between the metamask 120 and the photoalignment material 130 may be from about 0 to about 50 wavelengths of the light, including from about 0 to about 20 wavelengths of the light, from about 0.1 to about 10 wavelengths, and from about 0.5 to about 5 wavelengths.

Figure 3:
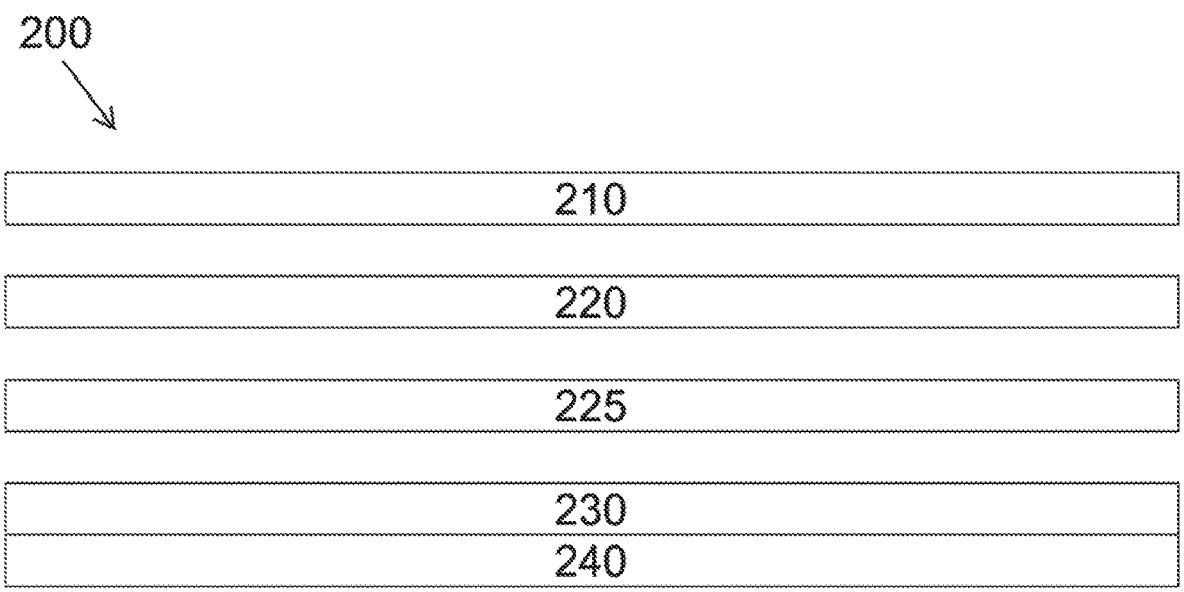
FIG. 3 is a schematic diagram illustrating a projection photopatterning system in accordance with some embodiments of the present disclosure.

A non-limiting example of a projection photopatterning system is shown in schematic FIG. 3. The system 200 includes a light source 210, metamask 220, imaging lens or lens set 225, photoalignment material 230, and substrate 240. The lens set may include two objective lenses in some embodiments.

In some embodiments, the liquid crystals are thermotropic liquid crystals, lyotropic liquid crystals, or nematic elastomers. In some embodiments, the thermotropic liquid crystals are isotropic, nematic, cholesteric (e.g., helical cholesteric), smectic phase A, or smectic phase C. In some embodiments, the lyotropic liquid crystals are cylindrical nematic liquid crystals or lamellar liquid crystals.

The concepts, systems, and methods of the present disclosure may be used with flat substrates or curved substrates. In some embodiments, the concepts, systems, and methods are used with flexible substrates.

The concepts, systems, and methods of the present disclosure may be used in the production of devices with non-uniform directors (e.g., geometric phase optical components, programmable origami, stimuli-responsive sensors, and stimuli-responsive actuators). The geometric phase optical component may be a polarization grating, a polarization conversion system, a diffractive wave plate, a waveretarder, a beam steering device, or a beam shaping device.

In some embodiments, the metamasks of the present disclosure are made of nanocuboids (e.g., rectangular nanocuboids) of metallic materials arranged in an array. The metal may be elemental aluminum, an aluminum alloy, elemental silver, a silver alloy, elemental gold, a gold alloy, elemental copper, or a copper alloy in some embodiments.

In some embodiments, the nanocuboids are parallel to each other.

In some embodiments, the nanocuboids have a thickness in the range of from about 20 to about 500 nm.

The nanocuboids may have a short axis width of from about 30 to about 200 nm.

The nanocuboids may have a long axis length of from about 100 to about 300 nm.

The array may be periodic, quasi-periodic, or non-periodic.

In some embodiments, the array is arranged in lattice such as a triangular lattice. In some embodiments, the lattice has a periodicity of from about 170 to about 330 nm.

The array may be arranged on a substrate which is transparent to light of desired working wavelengths. In some embodiments, the substrate is made of quartz, fused quartz, $SiO_2$, sapphire ($Al_2O_3$), $CaF_2$, $MgF_2$, KCl, KBr, and/or normal glass. In the simulations, the substrate thickness was set at infinity to mimic normal glass slides, about 1 mm in thicknesses.

Figure 13:
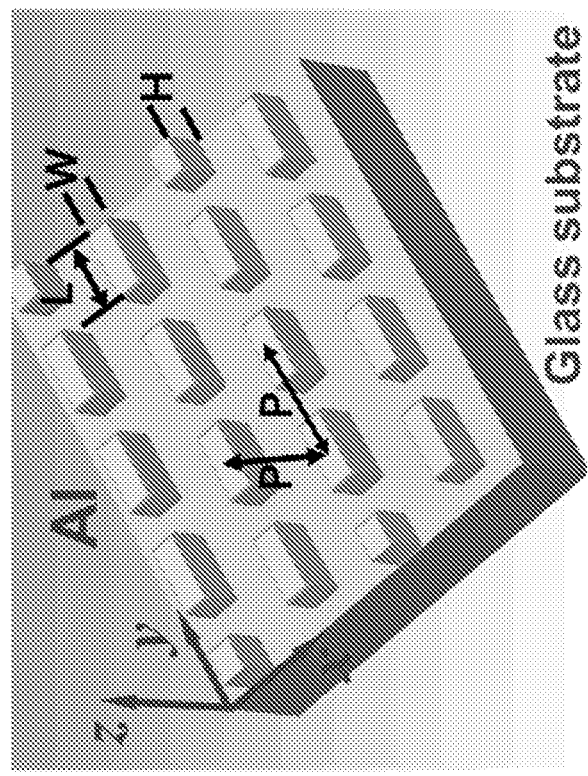
FIG. 13 illustrates a perspective view of an exemplary metamask made of nanocuboids arranged in a triangular lattice.

FIG. 13 is a schematic diagram showing a non-limiting example of a portion of a metamask. The metamask include aluminum rectangular nanocuboids on a glass substrate. The length, width, and height of the nanocuboids are denoted by L, W, and H, respectively. The periodicity is denoted by P. The x, y, and z directions are also labeled. As used herein, $T_x$ refers to the optical transmission for linear polarized light with polarization along the x-direction. $T_y$ refers to the optical transmission for linear polarized light with polarization along the y-direction. The polarization contrast (or Pol Contrast) refers to the ratio of $T_x/T_y$.

Figure 14:
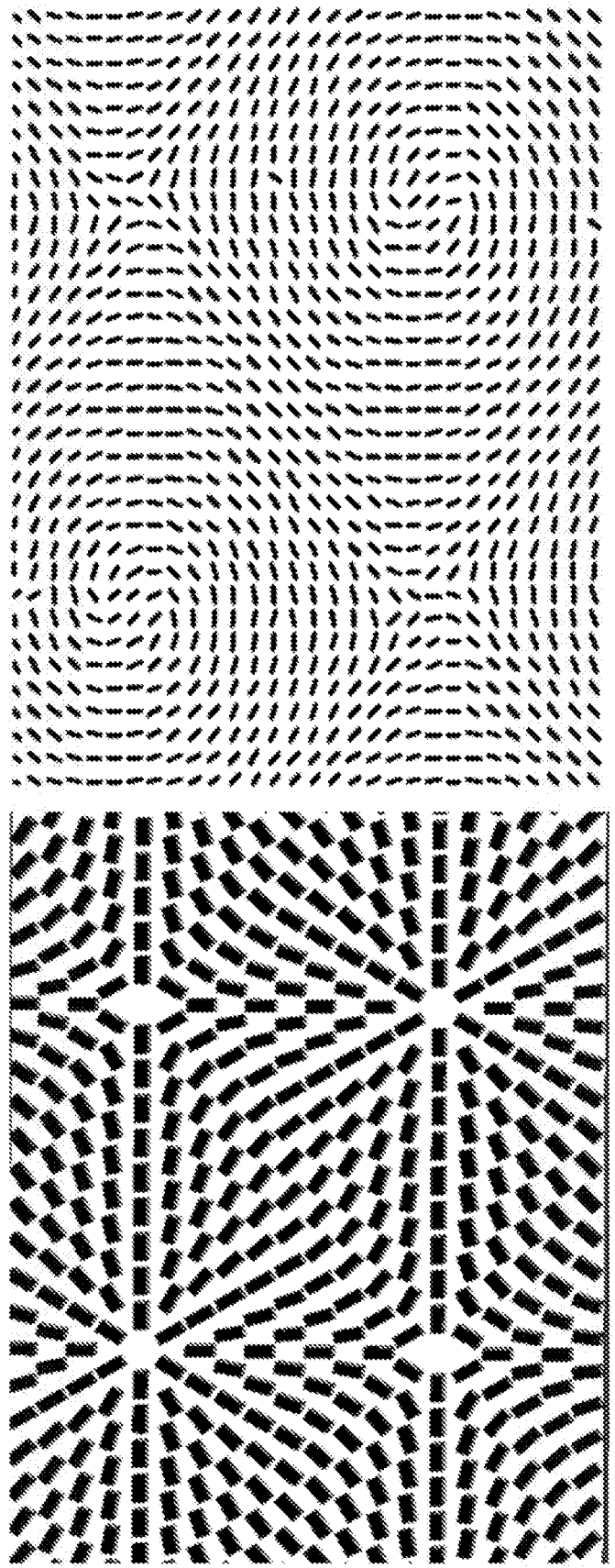
FIG. 14 illustrates an exemplary arrangement of rectangular nanocuboid elements (e.g., aluminum rectangular nanocuboid elements) and a polarization pattern that may be formed for light transmitted through such a metamask.

FIG. 14 illustrates a non-limiting example of an array of nanocuboids and a non-limiting example of the simulated polarization of transmitted light.

Figure 15:
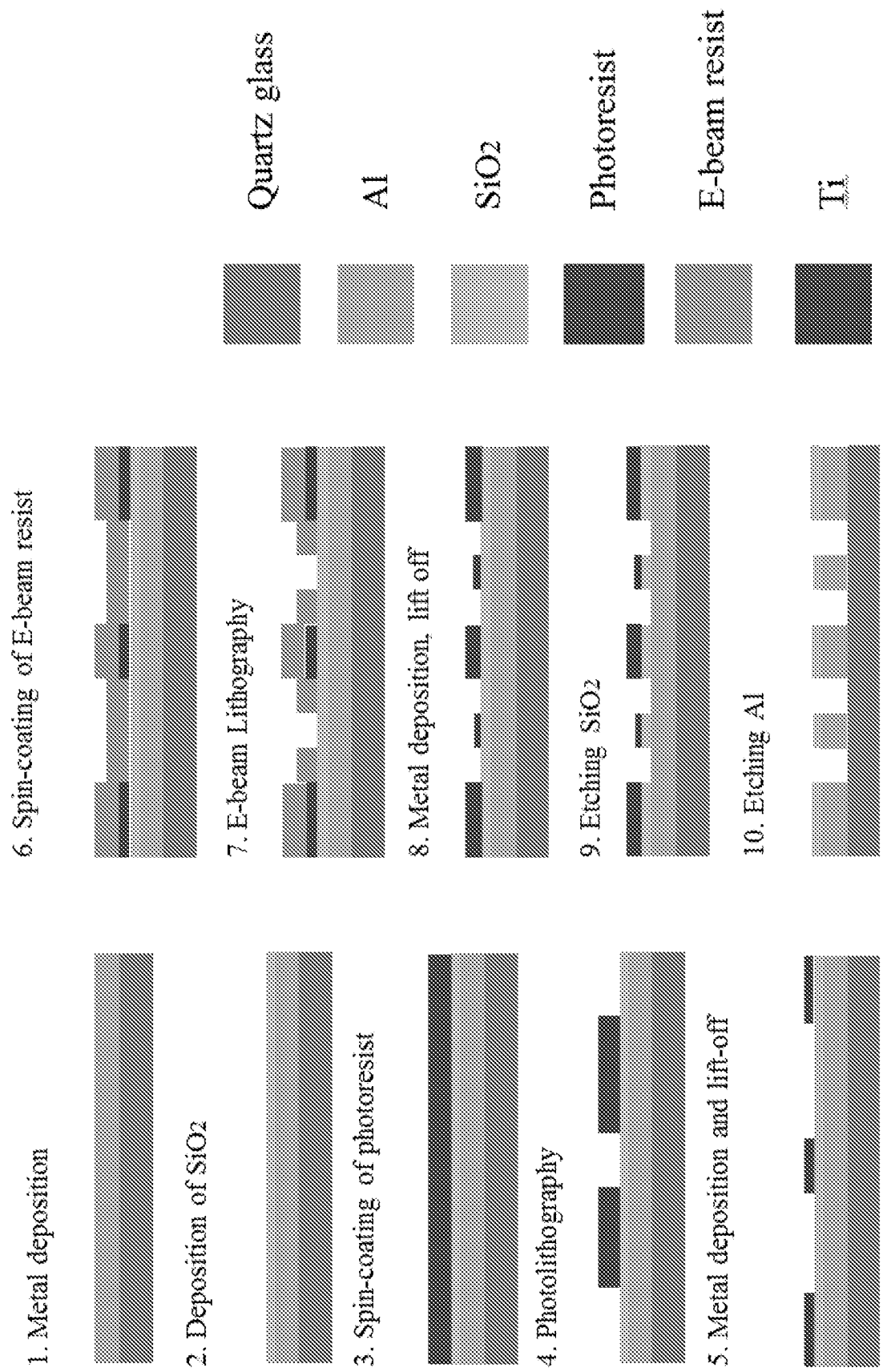
FIG. 15 illustrates an exemplary plasmonic metamask fabrication process in accordance with some embodiments of the present disclosure.

FIG. 15 illustrates a non-limiting example of a method in accordance with some embodiments of the present disclosure. The method include metal deposition 1, deposition of $SiO_2$ 2, spin-coating of photoresist 3, photolithography 4, metal deposition and lift-off 5, spin-coating of E-beam resist 6, e-beam lithography 7, metal deposition and lift-off 8, etching $SiO_2$ 9, and etching aluminum 10.

The nanocuboid arrays may have optical transmissions approaching 90% (e.g., from 80% to 90%, from 90 to 95%).

In some embodiments, the height H is in the range of from about 40 to about 500 nm, including from about 60 to about 150 nm and about 80 to about 130 nm.

In some embodiments, the periodicity P is in the range of from about 100 to about 500 nm, including from about 150 to about 300 nm and from about 220 to about 240 nm.

In some embodiments, the length L is in the range of from about 50 to about 400 nm, including from about 100 to about 250 nm and from about 140 to about 200 nm.

In some embodiments, the width W is from about 30 to about 200 nm, including from about 50 to about 125 nm and from about 60 to about 100 nm.

The ratio of the height to the length may be in the range of from about 0.3 to about 4.3, including from about 1 to about 3 and from about 1.07 to about 2.50. The ratio of the height to the width may be in the range of from about 0.2 to about 6, including from about 0.5 to about 3 and from about 0.90 to about 2.33. The ratio of the length to the width may be in the range of from about 1 to about 5, including from about 1.2 to about 4 and from about 1.40 to about 3.33.

Non-limiting examples of wavelength bands include from about 300 nm to about 600 nm, including from about 340 nm to about 400 nm and from about 400 nm to about 600 nm.

A non-limiting list of advantages includes:
high transmission (e.g., about 90% to about 95%);
high resolution (diffraction limited, e.g., about 0.5 microns)
extremely simple design rules;
high throughput (single exposure, e.g., about 1 second);
scalability (compatible with commercial stepper system, low cost, repeatable); and
larger patterning area.

The following examples are provided to illustrate the devices and methods of the present disclosure. The examples are merely illustrative and are not intended to limit the disclosure to the materials, conditions, or process parameters set forth therein.

Numerical Simulations of the Plasmonic Polarization Metamasks

The systematic numerical simulations were performed using a commercial software package (CST MICROWAVE STUDIO). The CST algorithms solve the Maxwell equations using finite-integration techniques. The hexahedral mesh scheme was used with mesh sizes (≤10 nm) much smaller than the surface plasmon wavelength. The dielectric permittivity of Al was obtained by the reference. The dielectric permittivity of $SiO_2$ is fixed at 2.13 for all wavelengths. The thickness of the $SiO_2$ substrates were set as infinity, and the nanoaperture sizes and the Al film thicknesses were varied according to the designs or to the measured values of the fabricated samples. Circularly polarized plane waves, illuminated from the side of glass substrates, were used as the incident light. The electrical fields in the plane located at 500 nm above the Al mask in the air side were calculated to represent the transmitted light intensity and polarization directions.

Fabrication of the Plasmonic Polarization Metamasks

To fabricate the metamasks with nanoapertures in Al films, a 5 nm Ti adhesion layer and a 150 nm Al film are sequentially deposited on fused quartz glass slides by e-beam evaporation. Subsequently, a 20 nm $SiO_2$ film is deposited through plasma-enhanced chemical vapor deposition (PECVD) or physical vapor deposition such as sputtering. These glass substrates are then spin-coated with 100 nm films of poly(methyl methacrylate) (PMMA) as electron beam resist. After e-beam writing and resist development, the mask patterns in PMMA are transferred into $SiO_2$ through reactive ion etching (RIE) using the recipe: 10 SCCM $C_4F_8$, 174 SCCM He, and a pressure of 4 mTorr. In the last step, the patterned $SiO_2$ layers are used as masks for etching the aluminum films using the recipe: 30 SCCM $BCl_3$, 15 SCCM $Cl_2$, and 4 SCCM $CH_4$, and a pressure of 3 mTorr.

To fabricate the metamasks with Al nanocuboids, a 5 nm Ti adhesion layer and an Al film of desired thickness (e.g., 150 nm) are sequentially deposited on fused quartz glass slides by e-beam evaporation. Subsequently, a 30 nm $SiO_2$ film is deposited through physical vapor deposition, such as sputtering. These glass substrates are then spin-coated with photoresist, then patterned with photolithography and followed with metal-deposition and lift-off process to create an Al etching mask for metamask areas and alignment marks for the following e-beam lithography process. Then the substrates are spin-coated with e-beam resists such as PMMA, and patterned with e-beam lithography followed by deposition of Al and lift-off. Then, the Al patterns are used as the mask for etching $SiO_2$ using reactive ion etching, and the patterned $SiO_2$ layer is used as the mask for etching the Al film using reactive ion etching. The etching recipes used for fabricating metamasks using nanoaperture can be used here. A schematic process is shown in FIG. 15.

Liquid Crystal Materials and Cells

Glass slides were cleaned with detergent in an ultrasonic bath for half an hour and then exposed to UV ozone for 10 minutes to promote the hydrophilicity. These glass slides were then spin-coated with 0.5 wt % of brilliant yellow (BY) in dimethylformamide (DMF) and baked on a 90° C. hot stage for 20 minutes. With 1500 rpm spin speed, the measured thicknesses of the coated BY films are about 8 nm. Two glass substrates with the coated surfaces inside were assembled to form a liquid crystal cell. The cell thickness was controlled using fiber spacers. The measured cell thickness was ranged between 1.7 μm and 2.5 μm.

Projection Photopatterning System

A high power lamp of X-Cite series 120 was used as the light source for illuminating the plasmonic metamasks. The light transmitted through the metamasks was collected by the imaging objective and then coupled to the back aperture of the projection objective. The projection objective focuses the mask patterns (along with their polarization fields) onto the liquid crystal cells. An optical microscope, which is made of an objective, a tube lens, and a CCD camera, was used to inspect the liquid crystal cells and mask patterns to ensure that the mask patterns are at focus in the liquid crystal cell planes and overlap with marks on the substrates. The magnification between the projected pattern and the original mask was the ratio between the nominal magnifications of the projection and imaging objectives.

Polscope

The Pol-Scope illuminates the sample with monochromatic light ($\lambda$=546 nm) and maps optical retardance $\Gamma(x,y)$ and orientation of the slow axis of birefringence. For 5CB, the slow axis represents the long axis of 5CB molecules.

Example 1

Systematic computer simulations were carried out and yielded the following device guidance: (1) triangular lattices give rise to higher optical transmission that square lattices due to a higher packing fraction; (2) smaller film thicknesses yield higher transmittance but lower polarization contrast; (3) reduced lattice spacing leads to an increase in optical transmission; and (4) complex polarization fields can be generated in the transmitted light when the nanoaperture arrays are arranged in non-uniform orientations.

The calculated transmission spectra under normal incidence were generally composed of two overlapping peaks. The right peak at the longer wavelength is sensitive to variations in the nanoaperture shape and size. At the peak wavelength, the electrical field inside the nanoaperture is primarily perpendicular to the long axis with a bell-shaped distribution along the long axis, suggesting TM and TE waveguide modes in the short and long axes, respectively. The right peak can thus be attributed to a resonance of coupled cavities. The second peak at shorter wavelengths (<500 nm) is only sensitive to the variations of the periodicity. Its peak wavelength agrees with the excitation wavelength of the surface plasmon waves at the Al-substrate interface, suggesting the short wavelength peak results from the surface plasmon enhanced transmission.

Example 2

Triangular lattices of parallel rectangular nanoapertures were produced in 150 nm-thick aluminum films. Metamasks having four different periodicities (270 nm, 300 nm, 330 nm, and 360 nm) were produced. The average sizes of the nanoapertures were about 100 nm×about 250 nm. The measured transmissions spectra for polarization perpendicular to the long axis exhibit broadband peaks with the transmittance increasing as the periodicity is reduced. The measured transmission for polarization parallel to the long axis of the nanoapertures long axis is less than 5%, indicating a >5 dB polarization contrast. A condenser was used for illumination and to mimic the mask condition. Therefore, the measured transmission bandwidths are larger than the simulation results based on normal illumination.

Example 3

Figure 4:
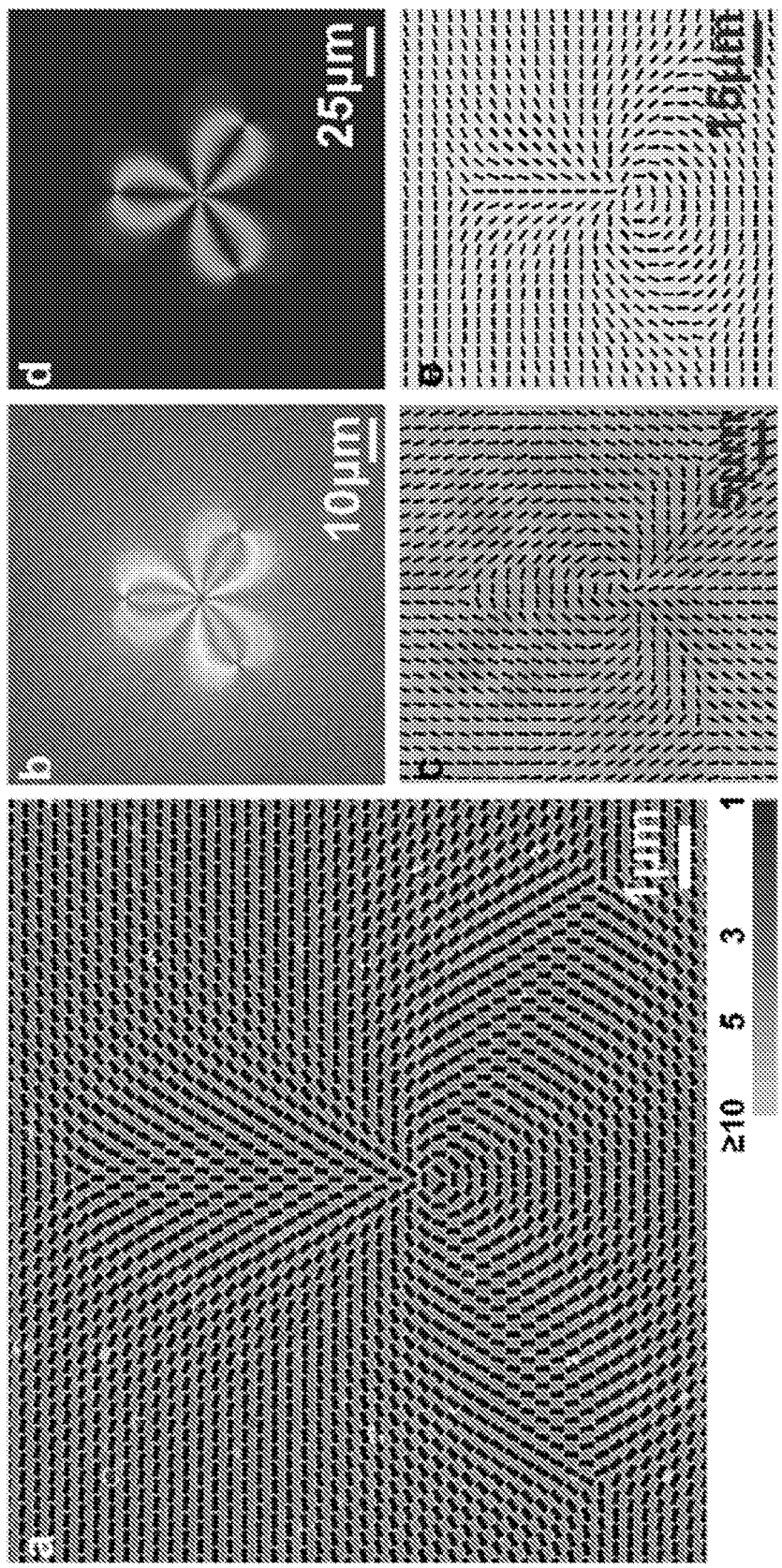
FIG. 4a is an SEM image of a plasmonic metamask as described in Example 3.
FIG. 4b is a transmission optical image as described in Example 3, which is made of nanoapertures in an Al film arranged in a triangular lattice.
FIG. 4c illustrates the measured polarization field as described in Example 3.
FIG. 4d is a cross-polarized optical microscope image as described in Example 3.
FIG. 4e shows the Pol-Scope measured molecular orientation field as described in Example 3.

As a proof-of-capability for arbitrary designer patterns, plasmonic metamasks were designed for clusters and arrays of topological defects in a nematic liquid crystal. The topological defects were used for two reasons. First, they are accompanied by strong gradients of the director fields and thus allow testing of the spatial scale limits of the pattern design. Second, the topological defects in nematic liquid crystals are central elements of numerous applications, such as directed colloidal assembly, electrokinetic motion, and programmable origami. Two-dimensional director fields of a nematic liquid crystal satisfy the Laplace equation under single elastic constant approximation. For single topological defects, the director orientation angle iv can be expressed as a linear function of the azimuthal angle $\varphi$:

$$\psi = k\varphi + \psi_0$$

wherein k represents the defect strength or charge. Based on this equation and the principle of superposition, the nanoaperture orientations at position (x,y) in the metamasks for the defect clusters were set as $$\psi = \sum_i k_i \tan^{-1}\left(\frac{y - y_{i0}}{x - x_{i0}}\right) + \psi_{i0}$$

wherein $k_i$, $\psi_{i0}$, $x_{i0}$, and $y_{i0}$ are, respectively, the charge, initial angle, x and y coordinates of the i-th defect. FIG. 4 is an SEM image of a plasmonic metamask with a cluster of 4 topological defects. In FIG. 4a, $k_1$=1.5, $\psi_{10}$=0, $k_i$=−0.5, and $\psi_{i0}$=0 where i=2-4.

FIG. 4b is a transmission optical image of the plasmonic metamask under illumination of non-polarized white light. Spatial non-uniformity can be seen in the optical transmission, which can be attributed to the complex interferences of the light emerging from individual apertures. While this spatial non-uniformity inevitably causes variations in the threshold exposure time in photoalignment, its impact on alignment patterning can be circumvented by over-exposing these high-transmission regions.

FIG. 4c shows the measured polarization field for the plasmonic metamask wherein the background color represents polarization contrast as indicated by the colored scale bar. Local polarization directions are perpendicular to the average orientations of the nanoapertures in the metamask, which is in agreement with simulations. Generally, areas with parallel nanoapertures provide higher polarization contrasts than areas with non-uniform nanoaperture orientations, and the polarization contrasts are ranged between about 3 and about 10.

The non-uniformity in optical transmission can be attributed to minor orientation dependence of the nanoaperture size introduced in the mask fabrication processes and to the non-uniform polarization patterns. The azimuthally variant polarization directions generate optical vortexes, leading to non-uniform intensity distribution. For example, the dark spots at the defect centers in FIG. 4b are a characteristic feature of optical vortexes.

Figure 5:
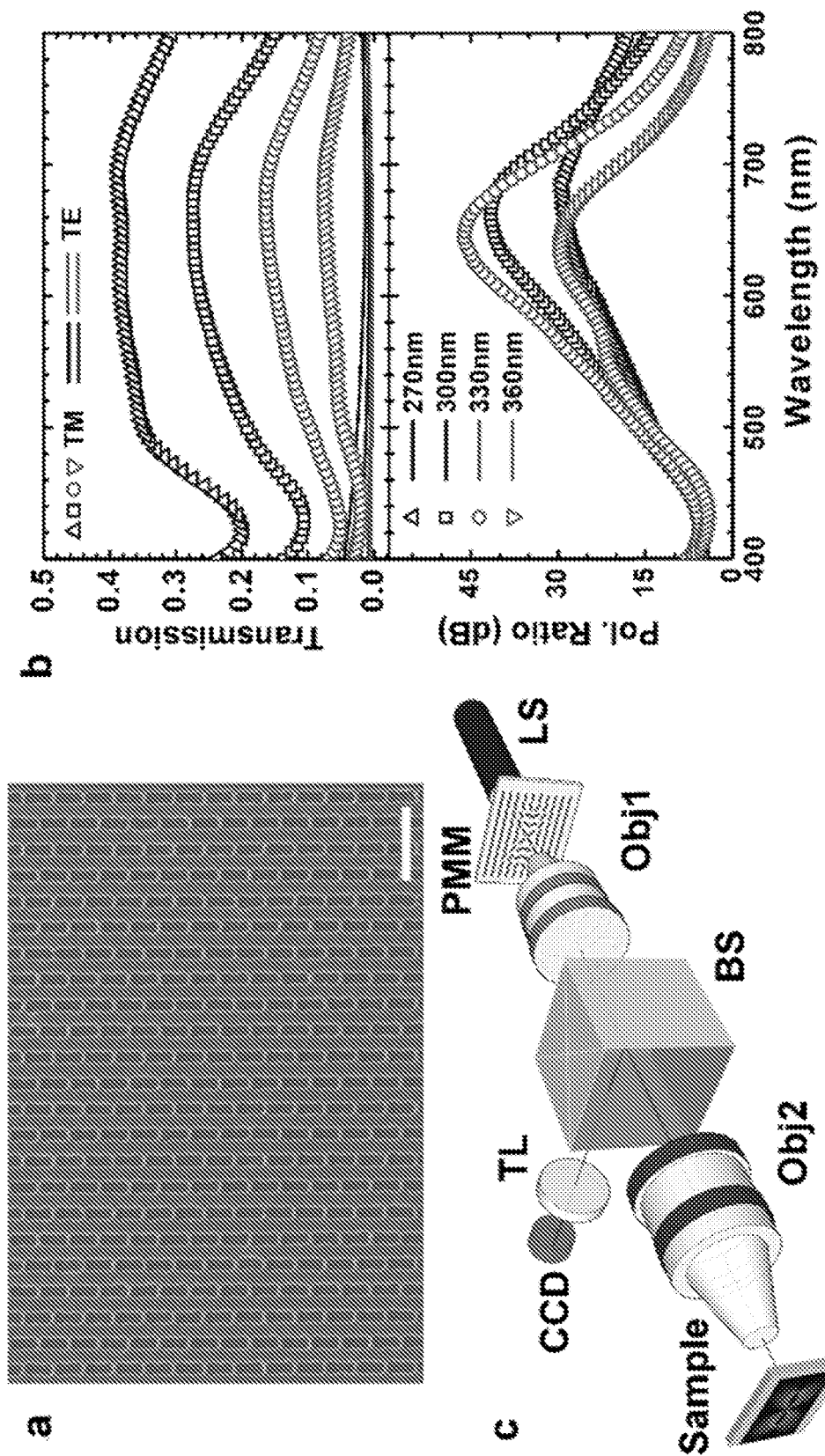
FIG. 5a is an SEM image of a parallel nanoaperture array with 270 nm periodicity.
FIG. 5b is a graph showing the measured transmission spectra and polarization ratio for parallel aperture arrays with different periodicities.
FIG. 5c schematically illustrates a photopatterning system that may be used in accordance with some embodiments of the methods of the present disclosure.

FIG. 5a is a SEM image of a parallel nanoaperture array with 270 nm periodicity. FIG. 5b is a graph showing the measured transmission spectra and polarization ratio for parallel aperture arrays with different periodicities. FIG. 5c schematically illustrates a photopatterning system that may be used in some embodiments of the present disclosure wherein Obj1 is an imaging objective, Obj2 is a projection objective, LS is a light source, TL is a tube lens, and BS is a beam splitter. The scale bar in FIG. 5a is 1 μm.

The projection system can be used to image the transmitted light of the metamasks onto liquid crystal cells in which the surfaces are coated with films of photoalignment materials (e.g., ~8 nm thick films). When the cell thickness is within the field depth of the objectives, the top and bottom substrates can be exposed simultaneously. Depending on the numerical aperture (NA) of the objectives, the field depth, approximated as $\lambda/NA^2$, can range from 2 μm (0.5 NA) to 10 μm (0.2 NA).

The exposed cells are then filled with nematic liquid crystal material 4-cyano-4'-pentylbiphenyl (5CB). Intriguing Schlieren textures can be observed in these photopatterned liquid crystal cells with a cross-polarized optical microscope.

FIG. 4d is a cross-polarized optical microscope image of the 4 defects patterned with the mask and shows the flower texture of one +1.5 and three −0.5 defects. Around individual defect centers are black brushes where the liquid crystal molecular directors are parallel to either the polarizer or the analyzer. The number $n_b$ of brushes represents the absolute charge of the defect: $|k|=n_b/4$.

Figure 8:
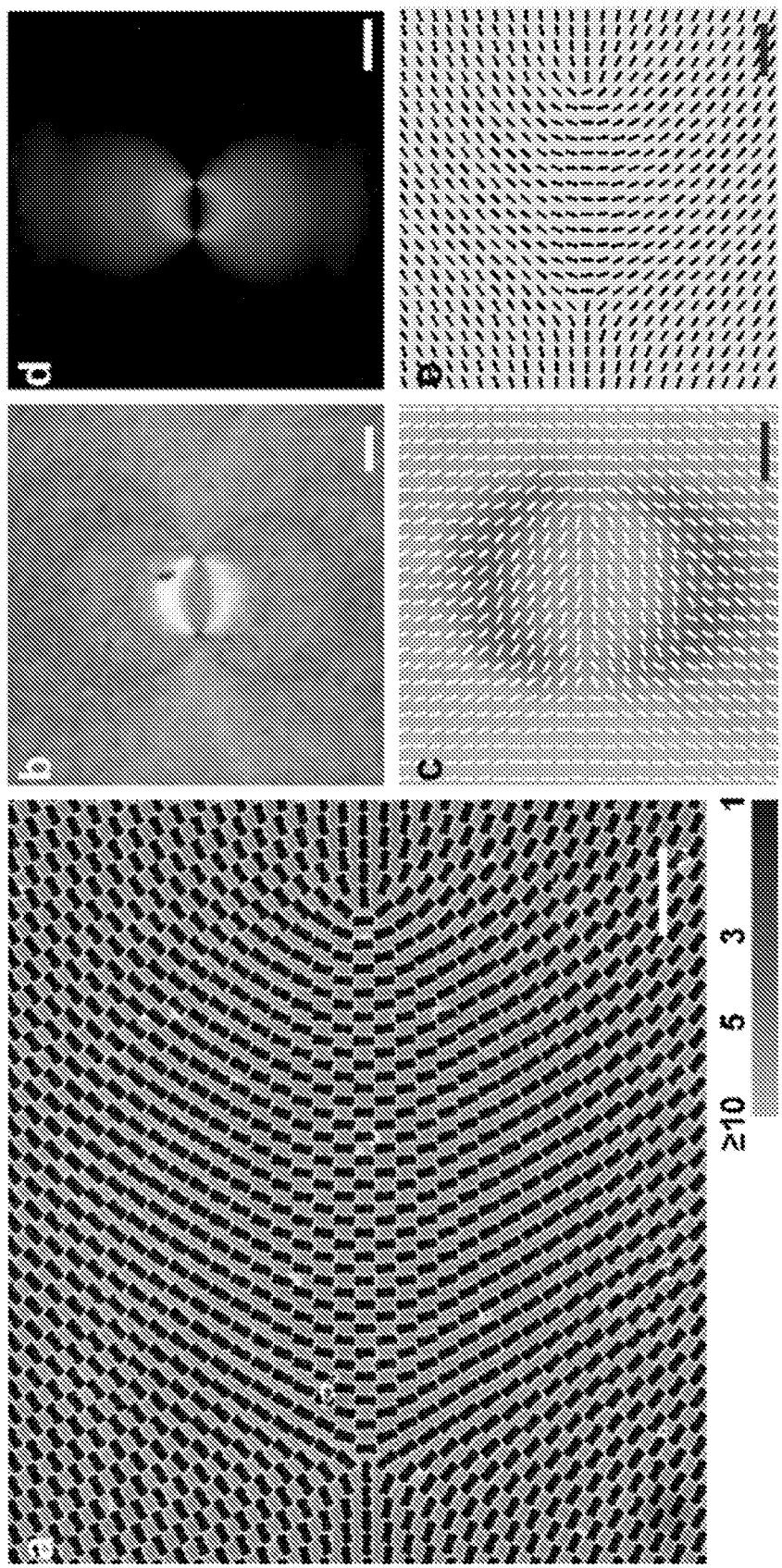
FIG. 8a is a SEM image of a plasmonic metamask as described in Example 6.
FIG. 8b is a transmission optical image as described in Example 6.
FIG. 8c illustrates the measured polarization field as described in Example 6.
FIG. 8d is a cross-polarized optical microscope image as described in Example 6.
FIG. 8e is a Pol-Scope of the measured molecular orientation field as described in Example 6.
Figure 9:
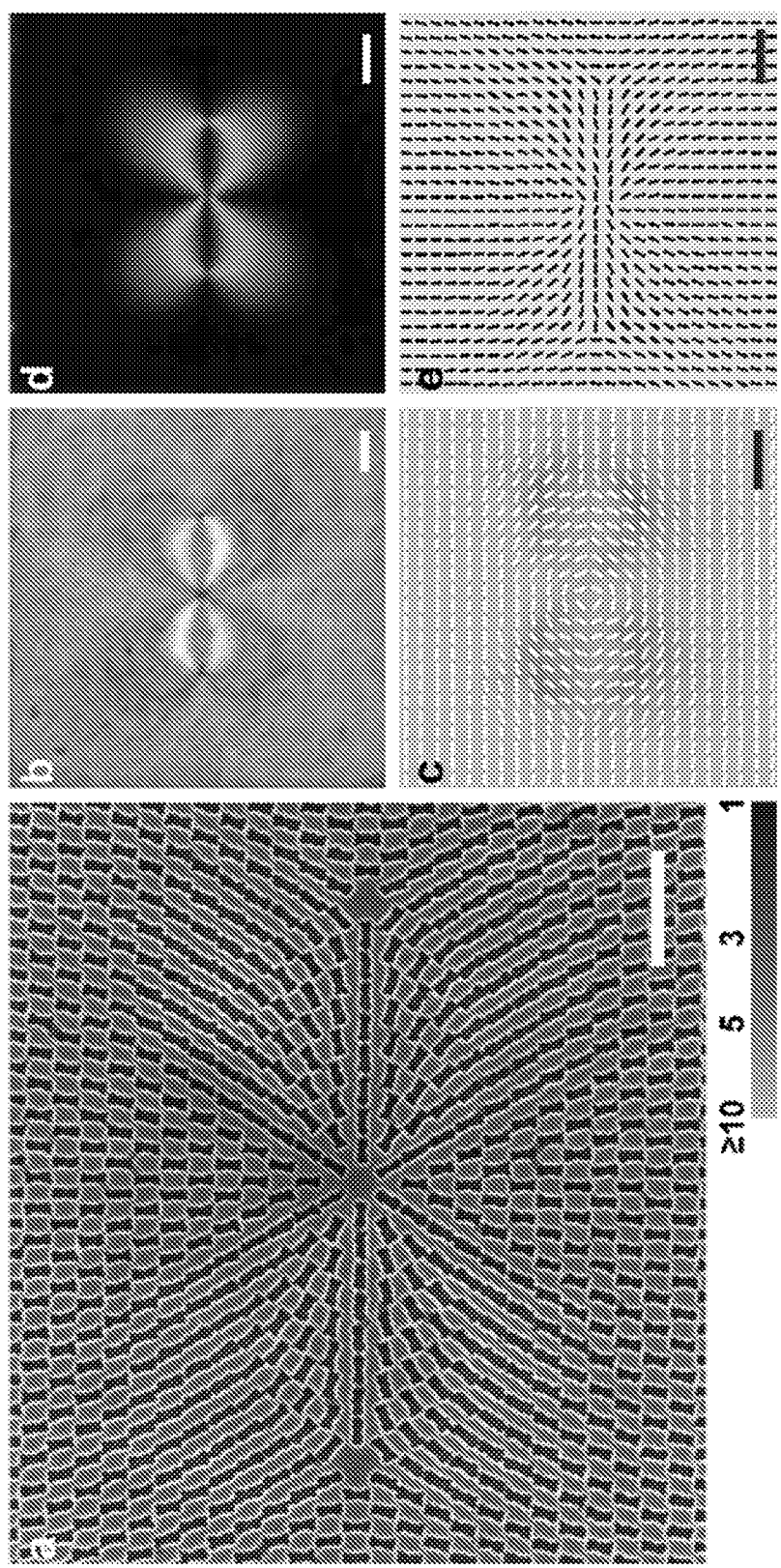
FIG. 9a is a SEM image of a plasmonic metamask as described in Example 7.
FIG. 9b is a transmission optical image as described in Example 7.
FIG. 9c illustrates the measured polarization field as described in Example 7.
FIG. 9d is a cross-polarized optical microscope image as described in Example 7.
FIG. 9e is a Pol-Scope of the measured molecular orientation field as described in Example 7.
Figure 10:
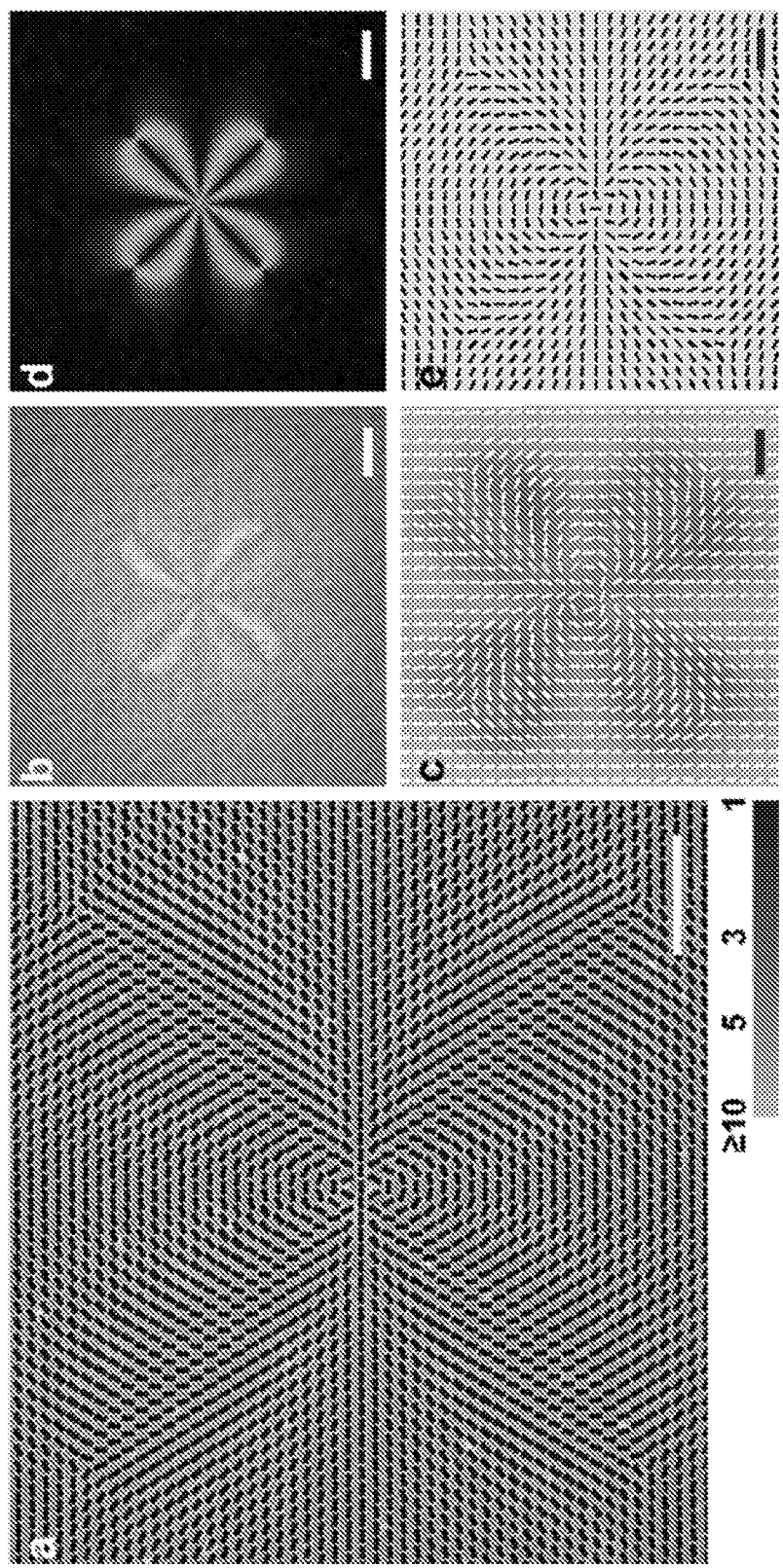
FIG. 10a is a SEM image of a plasmonic metamask as described in Example 8.
FIG. 10b is a transmission optical image as described in Example 8.
FIG. 10c illustrates the measured polarization field as described in Example 8.
FIG. 10d is a cross-polarized optical microscope image as described in Example 8.
FIG. 10e is a Pol-Scope of the measured molecular orientation field as described in Example 8.

FIG. 4e shows the Pol-Scope measured molecular orientation field. A comparison between the liquid crystal director pattern and the metamask shows that the photo patterned liquid crystal directors follow the nanoaperture orientations in the plasmonic metamask. Similar results are obtained for +0.5/−0.5 defect pair (FIG. 8), a cluster of +1/−0.5/−0.5 defects (FIG. 9), and a cluster of one +2 and four −0.5 defects (FIG. 10). This makes the metamask design straightforward: use the target molecular director patterns as the orientations for the nanoapertures. This simple design rule relies on the photo-induced isomerization of azo-dyes which transform from anisotropic trans state to isotropic cis state. Since this process requires an electrical field along the dipoles or the long axis of azo molecules, these trans molecules oriented perpendicularly to the light polarization will remain unaffected upon optical excitation. Therefore, the exposed photoalignment materials become anisotropic with an average molecular long axis perpendicular to the optical polarization.

The scale bars in FIG. 4a-e are 1 μm, 10 μm, 5 μm, 25 μm, and 15 μm, respectively.

Example 4

Metamasks for periodic arrays of topological defects were designed by tiling square patches of individual defects. The results are shown in FIG. 6a-j.

Figure 6:
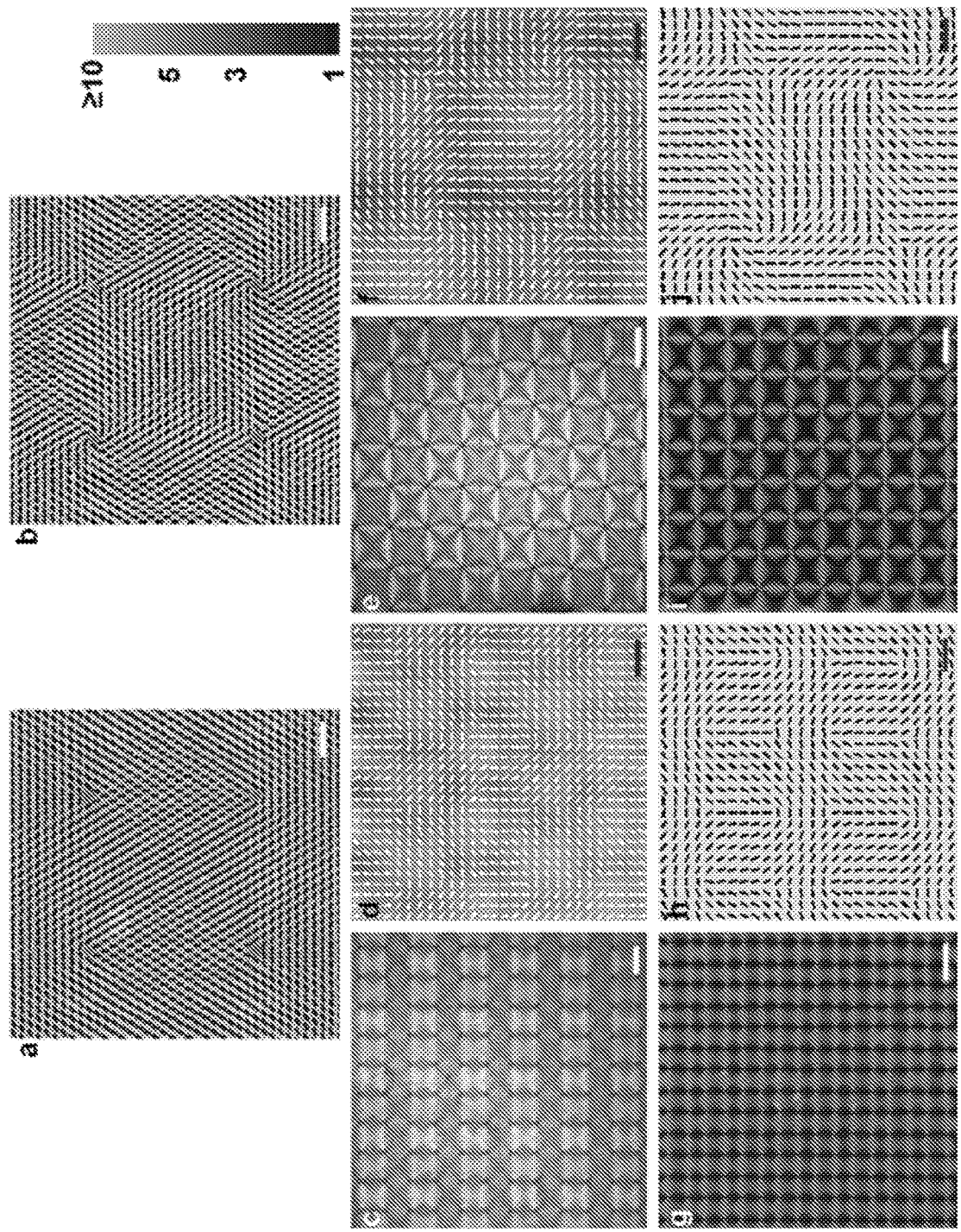
FIGS. 6a and b are SEM images of illustrative plasmonic metamasks as described in Example 4.
FIG. 6c-f present optical characterizations of metamasks for defect arrays as described in Example 4. Cross-polarized optical microscope images of Example 4 are shown in FIGS. 6g and i. Pol-Scope results of Example 4 are shown in FIGS. 6h and j.

FIGS. 6a and b are SEM images of illustrative plasmonic metamasks for +0.5/−0.5 and +1/−1 topological defect arrays. Each unit cell is composed of two positive defects and two negative defects with the same absolute charges. FIG. 6c-f present optical characterizations of the metamasks for the defect arrays. The measured polarizations of the transmitted light are perpendicular locally to the nanoaperture long axes. Transmission optical images of the plasmonic metamasks under illumination of non-polarized white light are shown in FIGS. 6c and e. Measured polarization fields for the plasmonic metamasks are shown in FIGS. 6d and f wherein the background color represents polarization contrast as indicated by the colored scale bar. Cross-polarized optical microscope images of the liquid crystal textures patterned with the masks are shown in FIGS. 6g and i. The liquid crystal director fields were measured by a Pol-Scope and are shown in FIGS. 6h and j. The scale bars represent 1 μm in FIGS. 6a and b; 2.5 μm in FIGS. 6d, f, h, and j; 5 μm in FIG. 6c; 10 μm in FIGS. 6e and g; and 25 μm in FIG. 6i.

To illustrate high spatial resolution that can be achieved with the disclosed systems and methods, arrays of +0.5 and −0.5 defects were patterned using a 50×0.55 NA image objective and a 40×0.6 NA projection objective. The microscope textures and the measured director field in FIGS. 6g and h demonstrate that 4.5 μm spacing between the defects is successfully achieved. Given that the diameter of the diffracted Airy disk (1.22λ/NA) is about 1 μm for λ=450 nm wavelength, the 4.5 μm defect spacing is approaching the diffraction limit of the system.

Example 5

Figure 7:
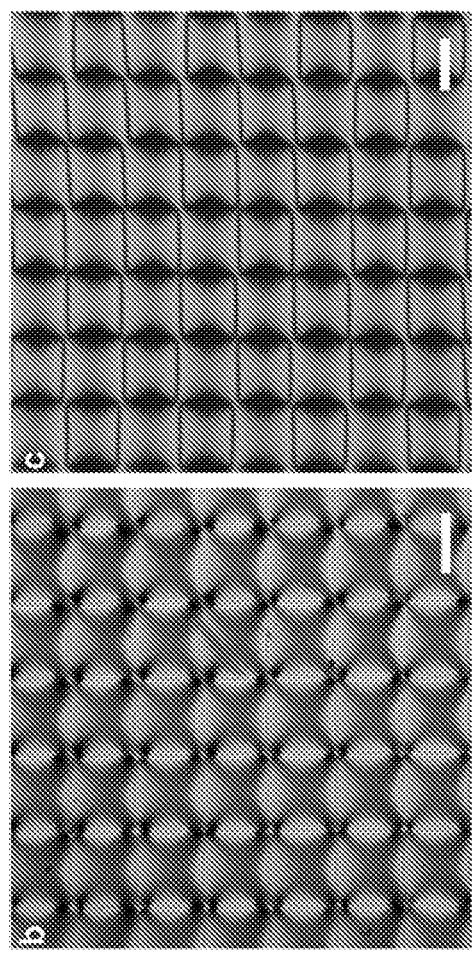
FIG. 7a illustrates patterns as described in Example 5.
FIGS. 7b and c are cross-polarized optical microscope images of liquid crystal textures as described in Example 5.
Figure 7:
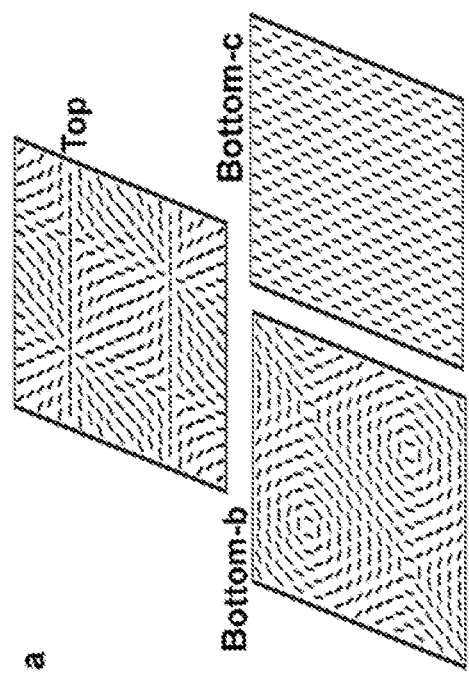

Some systems of the present disclosure are also capable of aligning different director patterns at the top and bottom surfaces, which are required by many applications. First, marks are fabricated on the top and bottom substrates and coated with photoalignment materials. After exposing patterns at predesigned positions on top and bottom substrates, liquid crystal cells can be assembled with the marks on the top and bottom substrates aligned. FIG. 7 presents two exemplary cases where both have the same top pattern of +1/−1 defect array with $\psi_0=0$, while one bottom pattern is the +1/−1 defect array with $\psi_0=\pi/2$ and the other is a uniform alignment. FIG. 7a schematically illustrates the patterns. The top pattern was the same of b and c. In b, the bottom pattern was arrays of +1 and −1 defects. In c, a uniform vertical alignment was used for the bottom pattern. FIGS. 7b and c are cross-polarized optical microscope images of liquid crystal textures with a different defect array on the bottom (b) and a uniform director at the bottom (c). The scale bars in FIGS. 7b and c are 200 μm and 20 μm, respectively. For the case where the defects of the same charge are shifted by one lattice spacing, the microscopic textures under cross-polarized microscopy show black lines connecting nearest defect centers (FIG. 7b). This can be understood by considering that going into the third dimension, the +1 (or −1) defects split into two +0.5 (or −0.5) defect lines which end up in the nearest lattice site on the opposite substrate. For the second case, defect lines connecting neighboring defect sites in the horizontal direction can be seen (FIG. 7c).

Example 6

A plasmonic metamask having patterns including two defect pairs of +0.5 and −0.5 charges was produced. FIG. 8a is a SEM image of the plasmonic metamask. For imaging clarity, the defect spacing is reduced in comparison to the real metamask shown in FIG. 8b. FIG. 8b is a transmission optical image of the plasmonic metamask under illumination of non-polarized white light. FIG. 8c illustrates the measured polarization field for the plasmonic metamask where the background color represents polarization contrast as indicated by the scale bar. FIG. 8d is a cross-polarized optical microscope image of the defects patterned with the mask. FIG. 8e is a Pol-Scope of the measured molecular orientation field. The scale bars in FIG. 8a through e are 1 μm, 2 μm, 2.5 μm, 20 μm, and 5 μm, respectively.

Example 7

A plasmonic metamask having patterns including one +1 defect and two −0.5 defects was produced. FIG. 9a is a SEM image of the plasmonic metamask. For imaging clarity, the defect spacing is reduced in comparison to the real metamask observed in FIG. 9b. FIG. 9b is a transmission optical image of the plasmonic metamask under illumination of non-polarized white light. FIG. 9c illustrates the measured polarization field for the plasmonic metamask where the background color represents polarization contrast as indicated by the scale bar. FIG. 9d is a cross-polarized optical microscope image of the defects patterned with the mask. FIG. 9e is a Pol-Scope of the measured molecular orientation field. The scale bars in FIG. 9a through e are 1 µm, 5 µm, 5 µm, 15 µm, and 10 µm, respectively

Example 8

A plasmonic metamask having patterns including one +2 defect and four −0.5 defects was produced. FIG. 10a is a SEM image of the plasmonic metamask. For imaging clarity, the defect spacing is reduced in comparison to the real made in FIG. 10b. FIG. 10b is a transmission optical image of the plasmonic metamask under illumination of non-polarized white light. FIG. 10c illustrates the measured polarization field for the plasmonic metamask where the background color represents polarization contrast as indicated by the scale bar. FIG. 10d is a cross-polarized optical microscope image of the defects patterned with the mask. FIG. 10e is a Pol-Scope of the measured molecular orientation field. The scale bars in FIG. 10a through e are 2 µm, 10 µm, 5 µm, 25 µm, and 10 µm, respectively

Example 9

Figure 11:
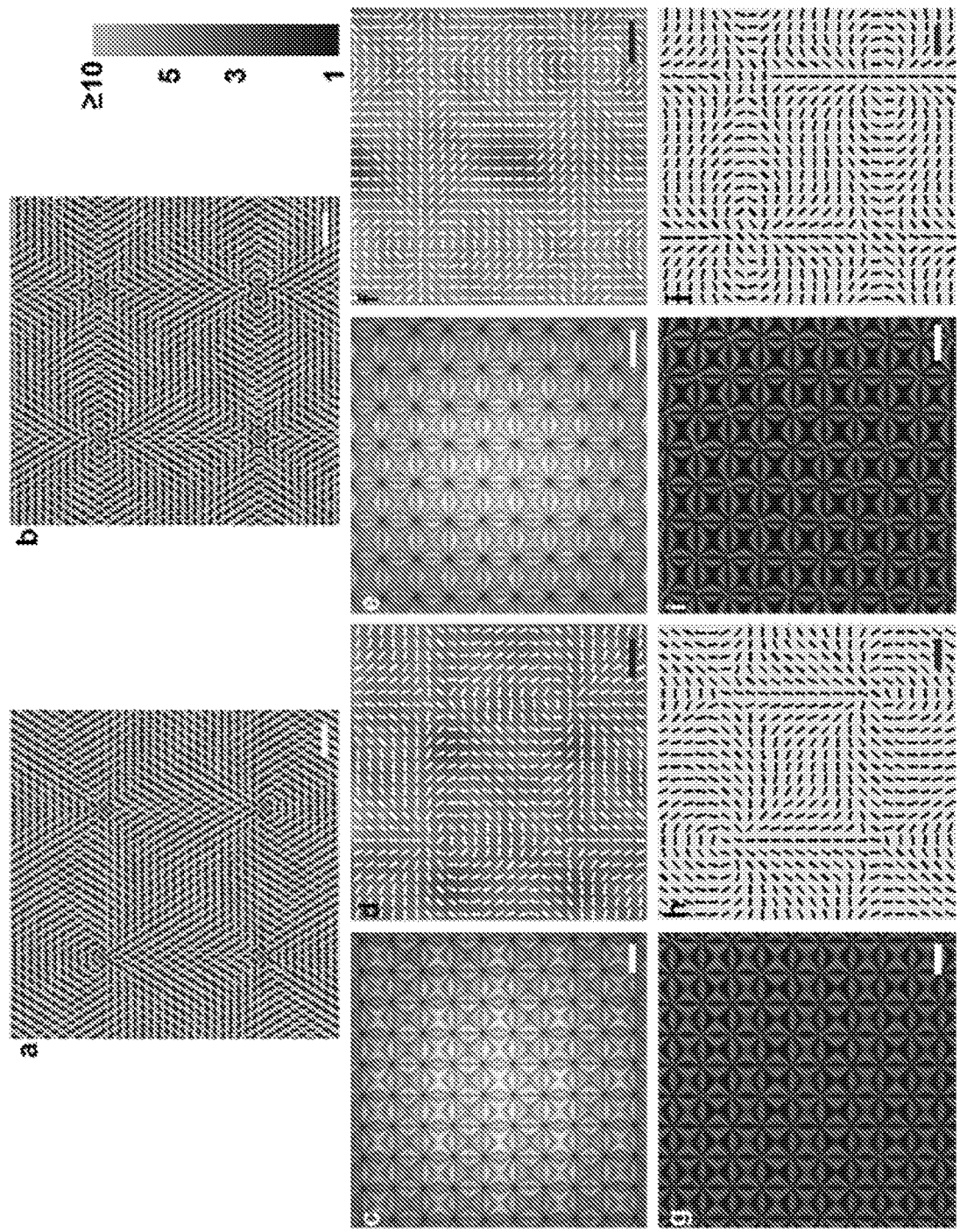
FIGS. 11a and b are SEM images of plasmonic metamasks as described in Example 9.
FIGS. 11c and e are transmission optical images as described in Example 9.
FIGS. 11d and f illustrate the measured polarization field as described in Example 9.
FIGS. 11g and i are cross-polarized optical microscope images as described in Example 9.
FIGS. 11h and j show Pol-Scope of the measured molecular field as described in Example 9.

Plasmonic metamasks having photopatterned defect arrays of +1.5/−1.5 charges and +2/−2 were produced. FIGS. 11a and b are SEM images of the plasmonic metamasks having defect arrays of +1.5/−1.5 and +2/−2, respectively. For imaging clarity, the defect spacing is reduced in comparison to the real made in FIGS. 11c and e. FIGS. 11c and e are transmission optical images of the plasmonic metamask under illumination of non-polarized white light. FIGS. 11d and f illustrate the measured polarization field for the plasmonic metamasks where the background color represents polarization contrast as indicated by the scale bars. FIGS. 11g and i are cross-polarized optical microscope images of the defects patterned with the masks. FIGS. 11h and j is a Pol-Scope of the measured molecular orientation field. The scale bars represent 1 µm in FIGS. 11a and b; 2.5 µm in FIGS. 11d, f, h, and j; 5 µm in FIG. 11c; 10 µm in FIGS. 11e and g; and 25 µm in FIG. 11i.

Example 10

Cholesteric liquid crystal cells were photopatterned. The cells were 4 µm thick. Brilliant yellow was used as the photoalignment material. The cholesteric liquid used was 5CB doped with 7 wt % CB15 ((S)-4-cyano-4'-(2-methylbutyl)biphenyl) at 25° C. The cholesteric pitch was 2 µm.

Example 11

Figure 12:
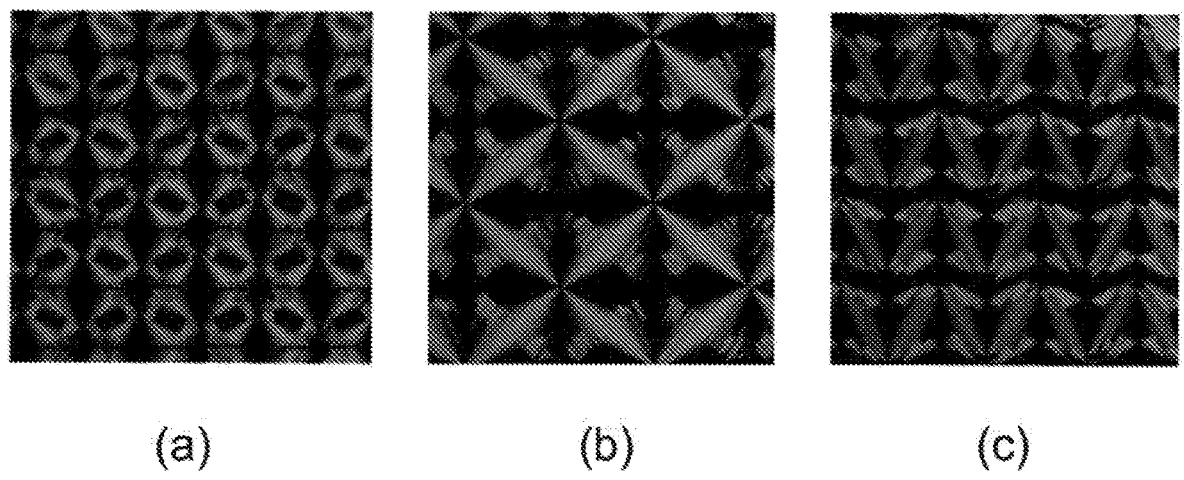
FIG. 12a-c are cross-polarized optical microscopic images for various patterns as described in Example 11.

Smectic (SmA phase) liquid crystal cells were photopatterned. The cells had a 8 µm thickness with inner surfaces coated with alignment materials photopatterned with plasmonic metamasks. The photoalignment material was brilliant yellow and the smectic liquid crystal was CCN47 (4'trans-butyl-4-cyano-4-trans-heptyl-1,1'-bicyclohexane) at 25° C. FIG. 12a-c are optical images for a sinusoidal function pattern, a +1/−1 defect array pattern, and a +0.5/−0.5 defect array pattern, respectively.

Example 12

The photoalignments of lyotropic liquid crystals was enhanced by using the following process. The photosensitive material Brilliant Yellow (BY) was mixed with N,N-Dimethylformamide (DMF) solvent at 0.3 wt % concentration. The BY solution was spin-coated on the glass substrates at 3000 rpm for 30 s. The glass plates were baked at 95° C. for 30 min, and exposure with the projection photo-patterning system. Then a toluene solution of monomer RM257 (4-(3-Acryloyloxypropyloxy)-benzoesure 2-methyl-1, 4-phenylester, from Merck) and Irgacure 651 (2,2-Dimethoxy-1,2-diphenylethan-1-one, from Ciba) was prepared with a 10 wt % of RM257 and 0.05 wt % of Irgacure 651. The solution was spin coated onto the exposed substrates at 3000 rpm for 30 s. The substrates were baked at 55° C. for 5 min to evaporate the solvent and then photo-polymerized for 30 min. Since the polymer covering the patterns is birefringent, the exposed director patterns were visible under the microscope. Two substrates were assembled together with the cell gap set by 5 µm glass spacers. The cell was filled with disodium cromoglycate (DSCG) solution and sealed promptly by an epoxy glue. The sealed cell was heated up to isotropic phase to eliminate all the flow alignment and cooled to the 25° C. at which the DSCG is in nematic phase.

Example 13

Computer simulations were conducted for aluminum rectangular nanocuboids. The simulation results are provided in FIGS. 16-21.

Figure 16:
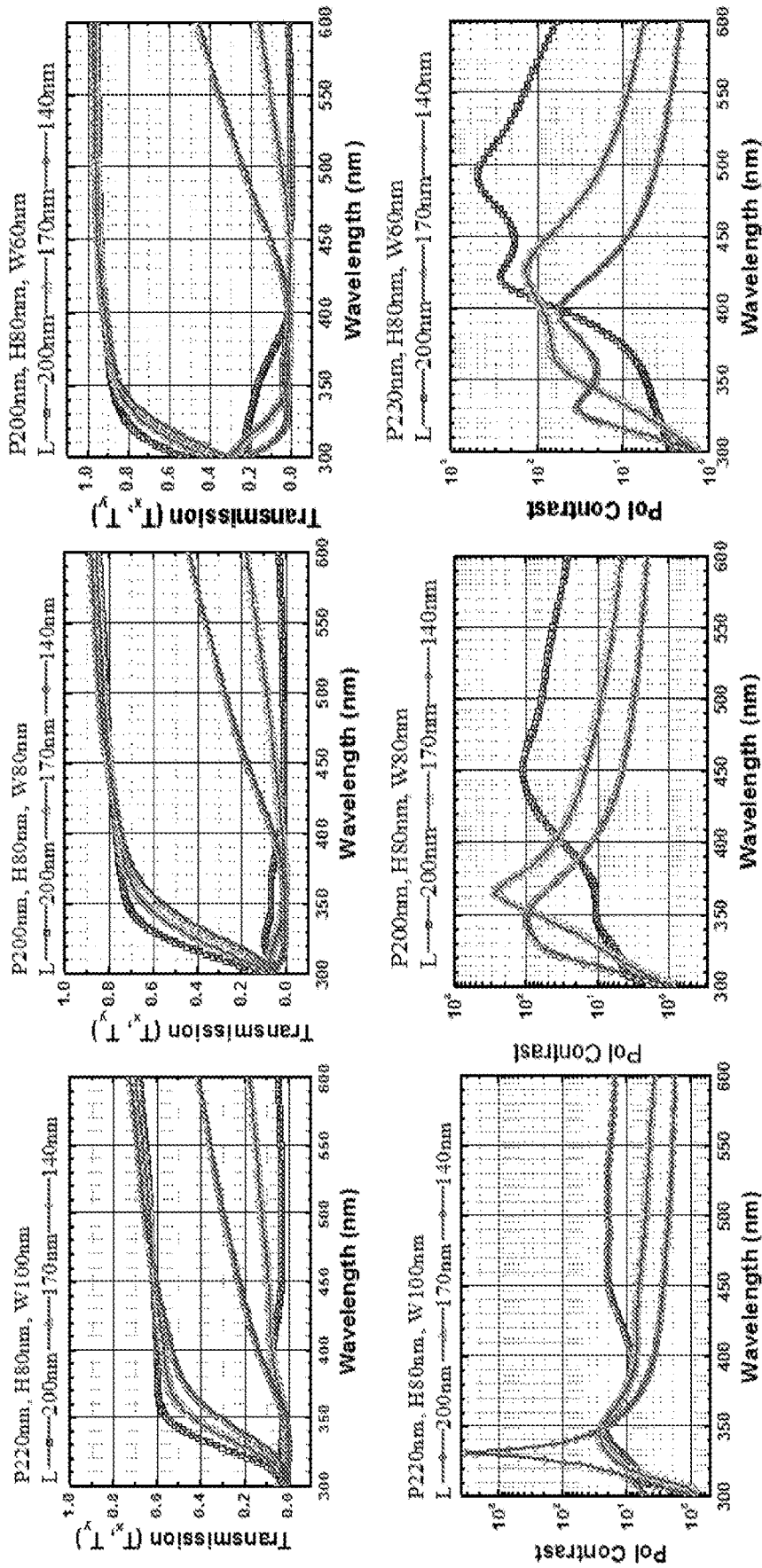
FIG. 16 is a set of graphs showing the simulated transmission and polarization contrast for the metamasks made of Al rectangular nanocuboid elements as shown in FIG. 13, having a fixed height of 80 nm, a fixed periodicity of 220 nm, and varying lengths and widths.

In the simulations of FIG. 16, the heights was fixed at 80 nm, the periodicity was fixed at 220 nm, the length was varied (140 nm, 170 nm, and 200 nm), and the width was varied (60 nm, 80 nm, and 100 nm).

Figure 17:
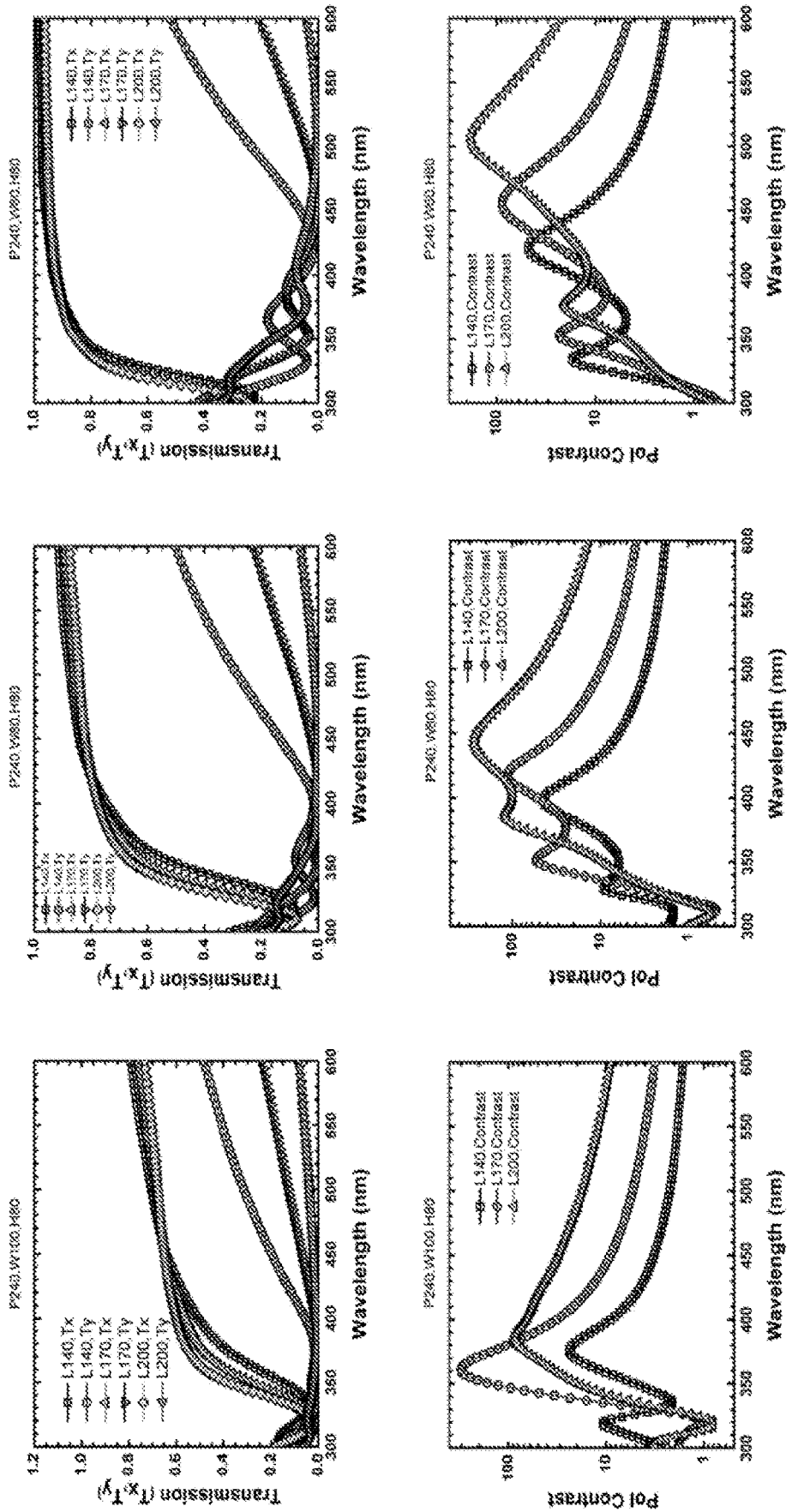
FIG. 17 is a set of graphs showing the effects on transmission and polarization contrast for the metamasks made of Al rectangular nanocuboid elements as shown in FIG. 13, having a fixed height of 80 nm, a fixed periodicity of 240 nm, and varying lengths and widths.

In the simulations of FIG. 17, the heights was fixed at 80 nm, the periodicity was fixed at 240 nm, the length was varied (140 nm, 170 nm, and 200 nm), and the width was varied (60 nm, 80 nm, and 100 nm).

Figure 18:
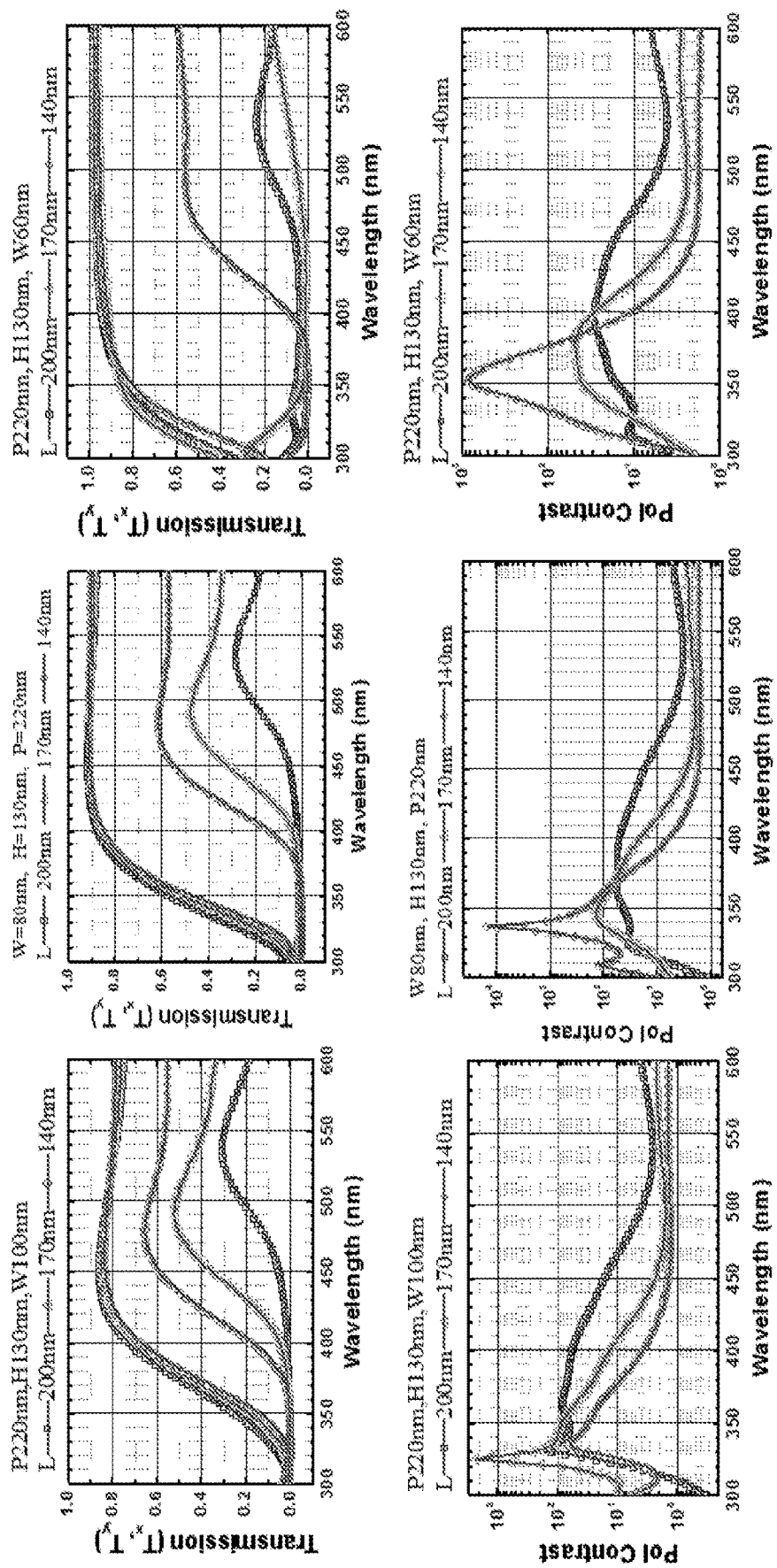
FIG. 18 is a set of graphs showing the simulated transmission and polarization contrast for the metamasks made of Al rectangular nanocuboid elements as shown in FIG. 13, having a fixed height of 130 nm, a fixed periodicity of 220 nm, and varying lengths and widths.

In the simulations of FIG. 18, the heights was fixed at 130 nm, the periodicity was fixed at 220 nm, the length was varied (140 nm, 170 nm, and 200 nm), and the width was varied (60 nm, 80 nm, and 100 nm).

Figure 19:
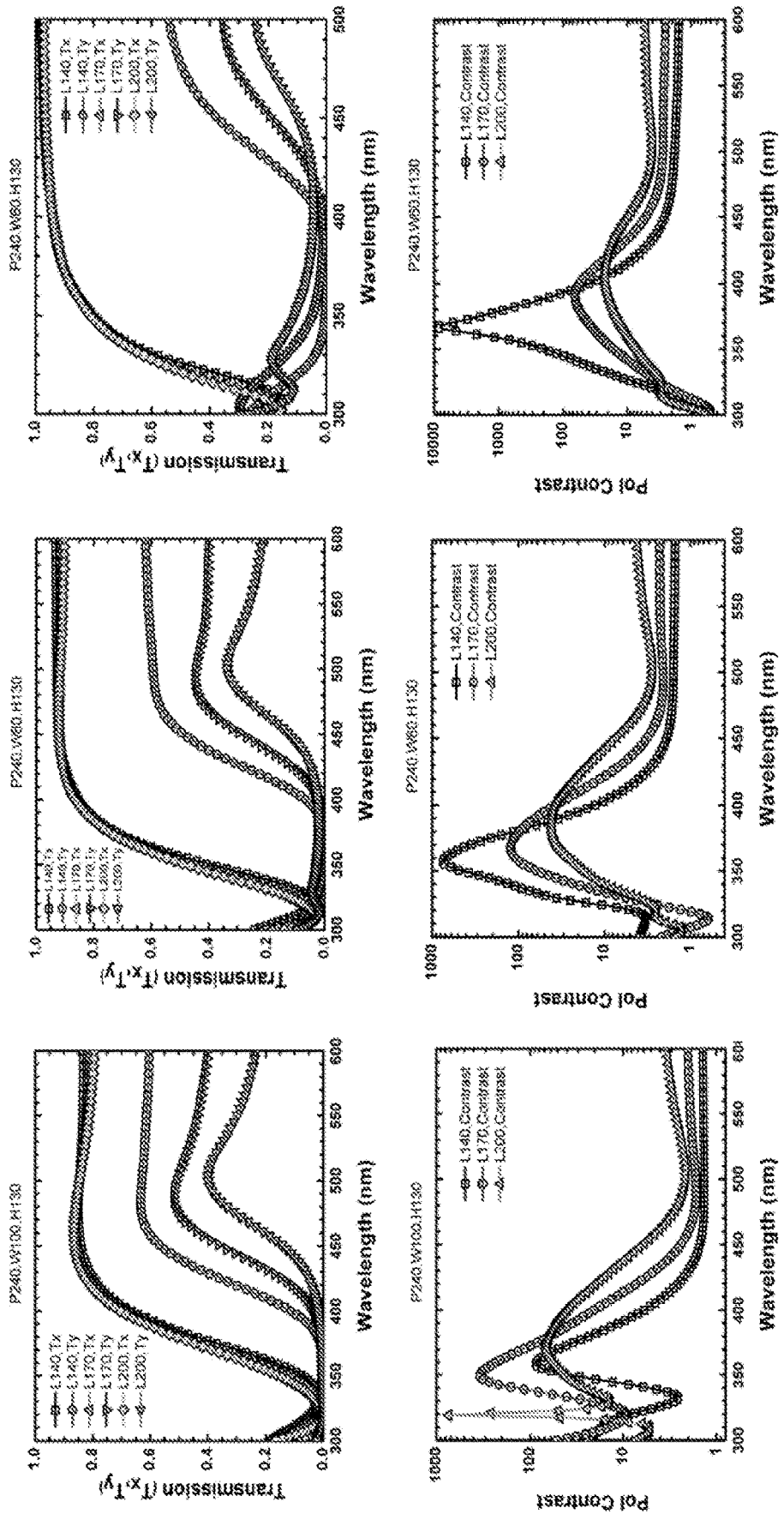
FIG. 19 is a set of graphs showing the simulated transmission and polarization contrast for the metamasks made of Al rectangular nanocuboid elements as shown in FIG. 13, having a fixed height of 130 nm, a fixed periodicity of 240 nm, and varying lengths and widths.

In the simulations of FIG. 19, the heights was fixed at 130 nm, the periodicity was fixed at 240 nm, the length was varied (140 nm, 170 nm, and 200 nm), and the width was varied (60 nm, 80 nm, and 100 nm).

Figure 20:
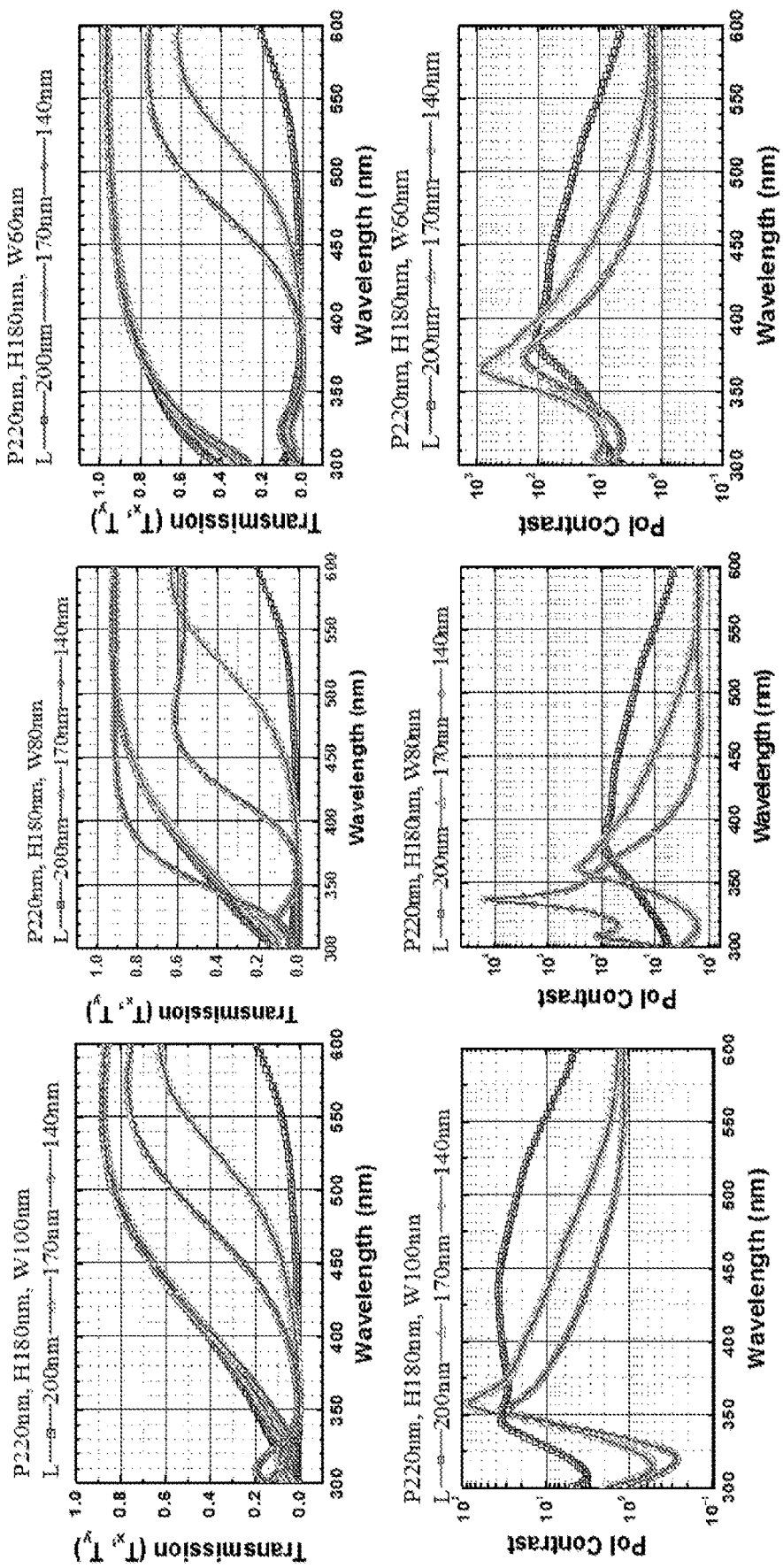
FIG. 20 is a set of graphs showing the simulated transmission and polarization contrast for the metamasks made of Al rectangular nanocuboid elements as shown in FIG. 13, having a fixed height of 180 nm, a fixed periodicity of 220 nm, and varying lengths and widths.

In the simulations of FIG. 20, the heights was fixed at 180 nm, the periodicity was fixed at 220 nm, the length was varied (140 nm, 170 nm, and 200 nm), and the width was varied (60 nm, 80 nm, and 100 nm).

Figure 21:
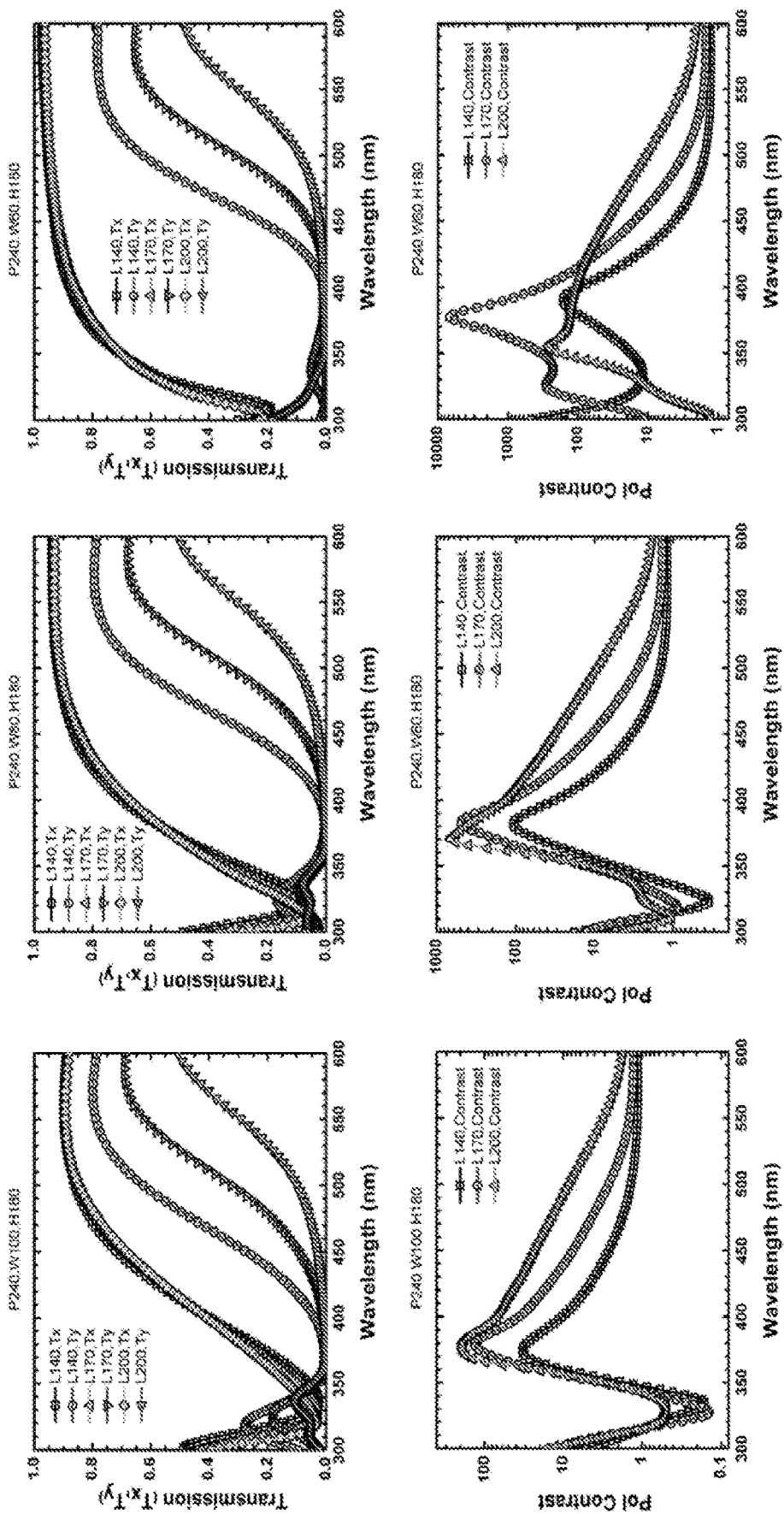
FIG. 21 is a set of graphs showing the simulated transmission and polarization contrast for the metamasks made of Al rectangular nanocuboid elements as shown in FIG. 13, having a fixed height of 180 nm, a fixed periodicity of 240 nm, and varying lengths and widths.

In the simulations of FIG. 21, the heights was fixed at 180 nm, the periodicity was fixed at 240 nm, the length was varied (140 nm, 170 nm, and 200 nm), and the width was varied (60 nm, 80 nm, and 100 nm).

By using nanocuboids with L=170 nm, W=60 nm, H=80 nm, P=220 nm or with L=170 nm, W=60 nm, H=130 nm, P=220 nm, the plasmonic metamasks can yield ~90% transmission and ~40 polarization contrast for wavelengths above 350 nm, suitable for photoalignment materials with UV absorption band. By using nanocuboids with L=200 nm, W=60 nm or 80 nm, H=80 nm, P=220 nm or with L=170 nm, W=60 nm, H=130 nm, P=220 nm, the plasmonic metamasks can yield above 90% transmission and >10 polarization contrast for wavelengths above 400 nm, suitable for photoalignment materials with visible absorption band.

Example 14

Figure 22:
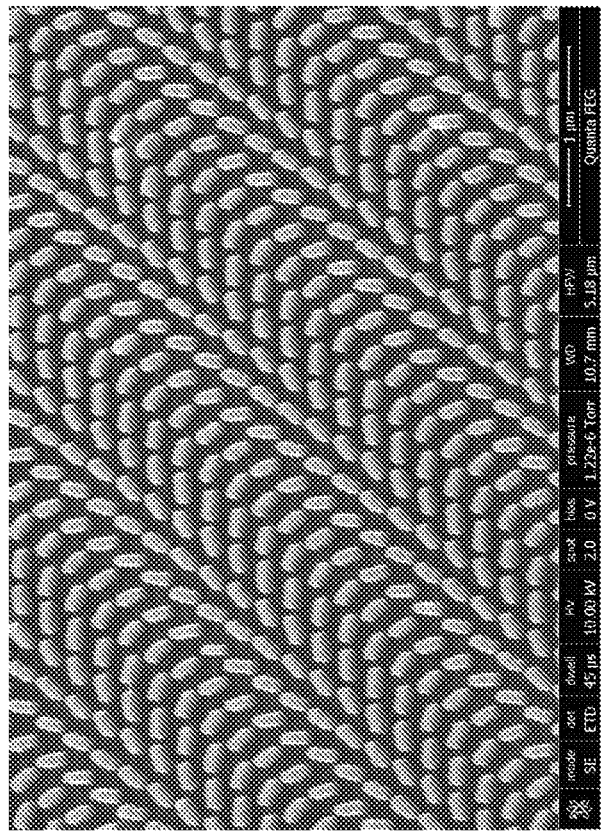
FIG. 22 includes two examples of SEM images of fabricated metamasks.
Figure 22:
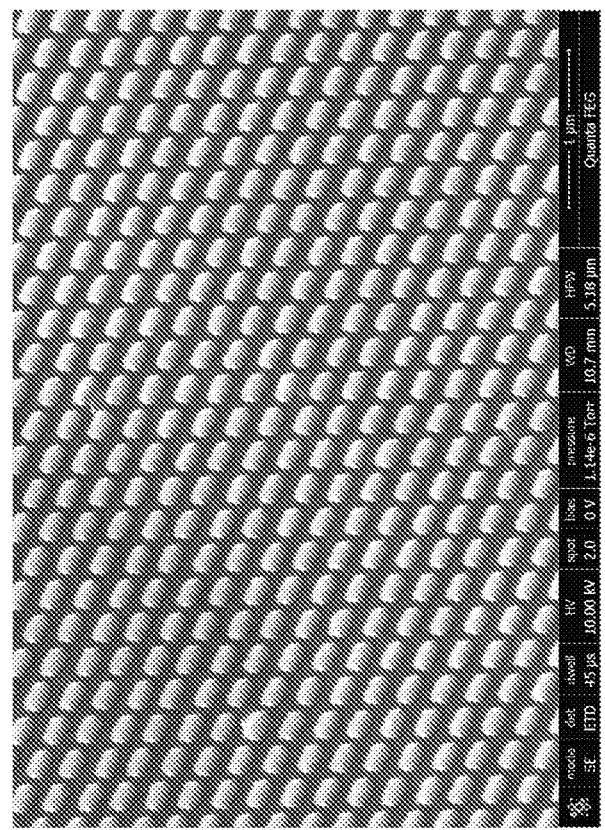

Metamasks were fabricated. SEM images of examples of the fabricated metamasks are shown in FIG. 22.

Example 15

Figure 23:
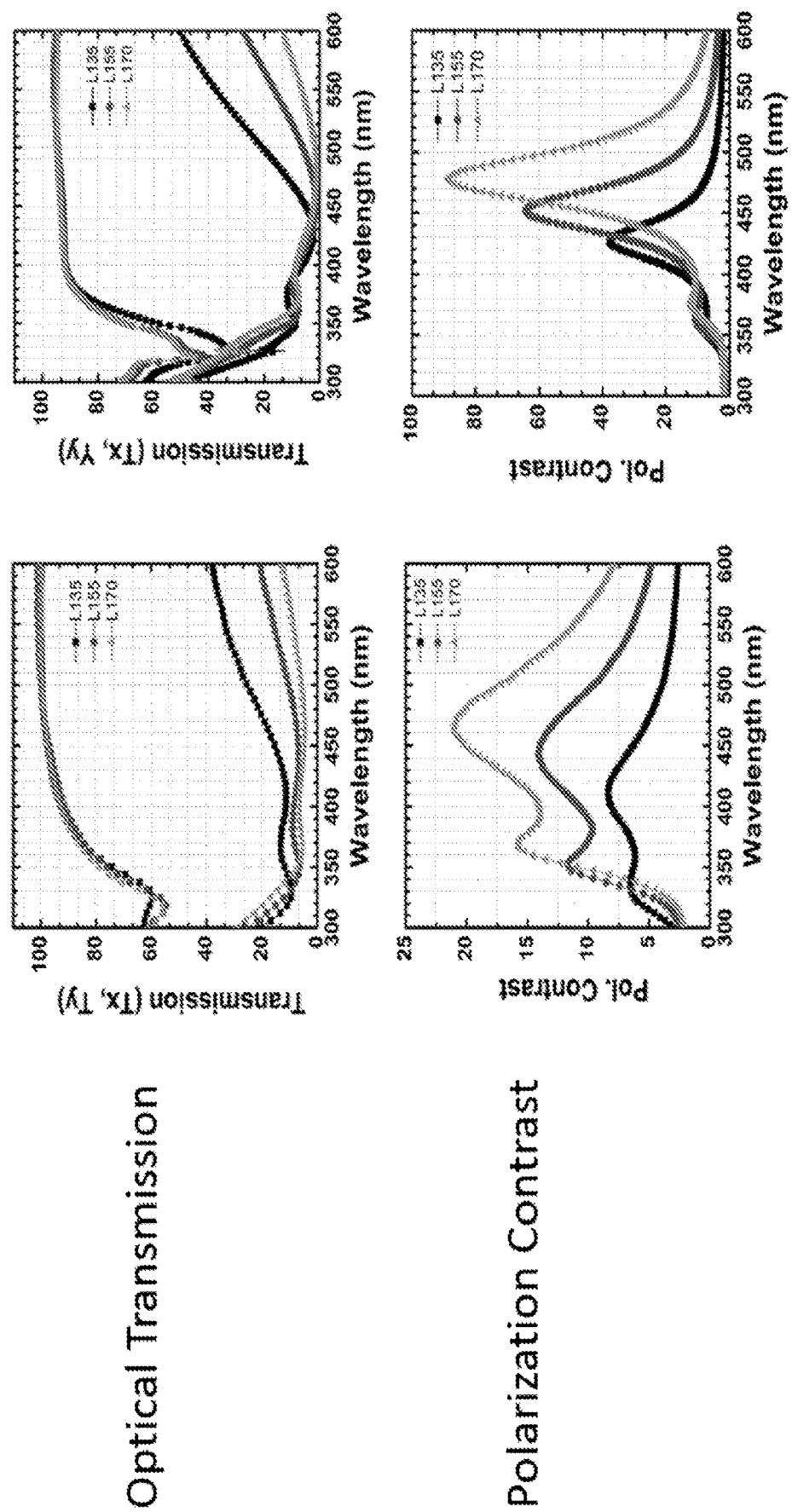
FIG. 23 illustrates measured and simulation results for optical transmission and polarization contrast for metamasks made of Al nanocuboid elements with width of 50 nm, height of 80 nm, and periodicity of 220 nm. Length was varied (e.g., 135, 155, and 170 nm).

Metamasks having nanocuboid elements with the following parameters were fabricated: width=50 nm; height=80 nm; periodicity=220 nm; and length varying from 135 nm to 155 nm to 170 nm. Measured and simulation results for optical transmission and polarization contrast are in good agreement as shown in FIG. 23.

Example 16

Figure 24:
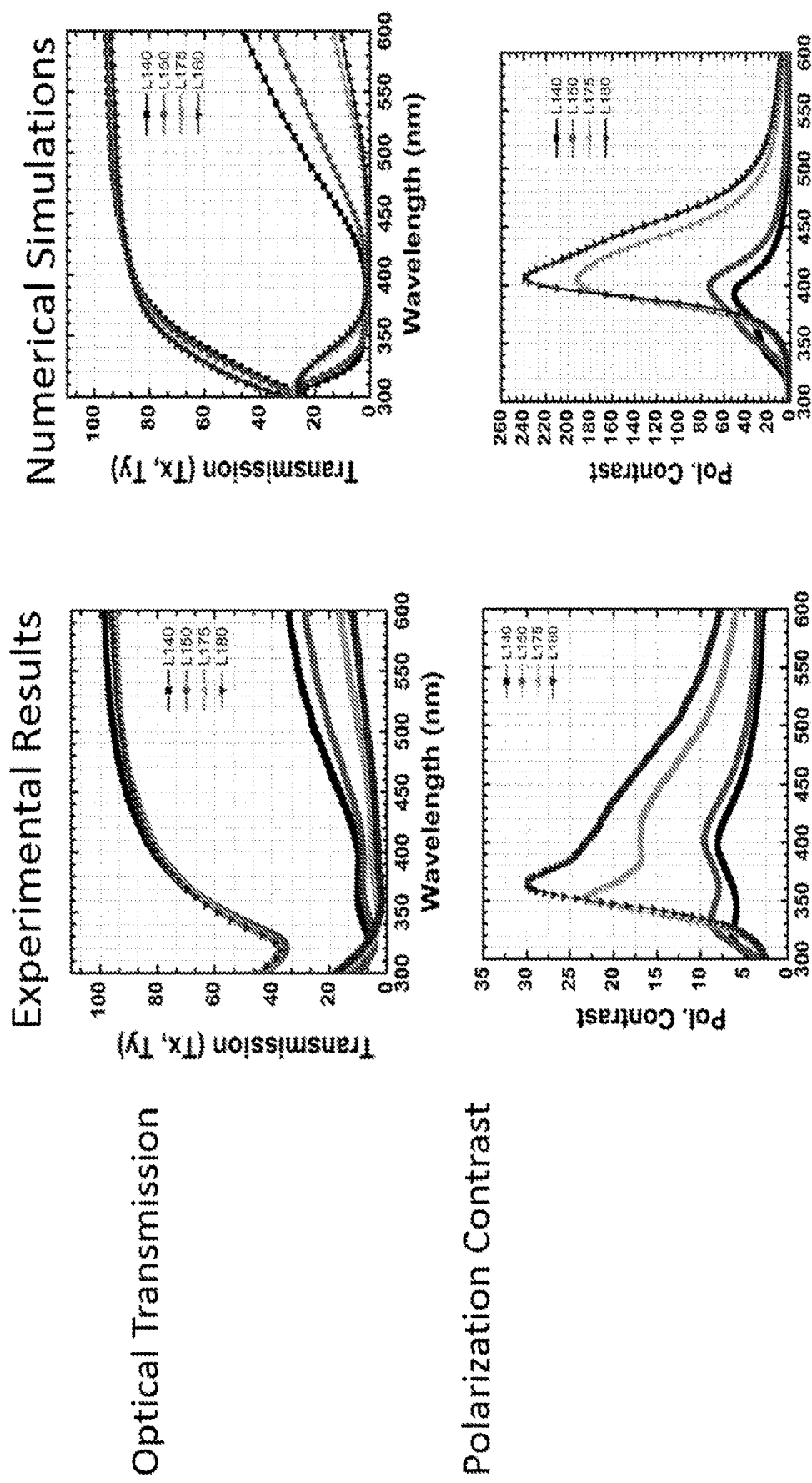
FIG. 24 illustrates measured and simulation results for optical transmission and polarization contrast for metamasks made of Al nanocuboid elements with width of 70 nm, height of 80 nm, and periodicity of 220 nm. Length was varied (e.g., 140, 150, 175, and 180 nm).

Metamasks having nanocuboid elements with the following parameters were fabricated: width=70 nm; height=80 nm; periodicity=220 nm; and length varying from 140 nm to 150 nm to 175 nm to 180 nm. Measured and simulation results for optical transmission and polarization contrast are in good agreement as shown in FIG. 24.

Example 17

Figure 25:
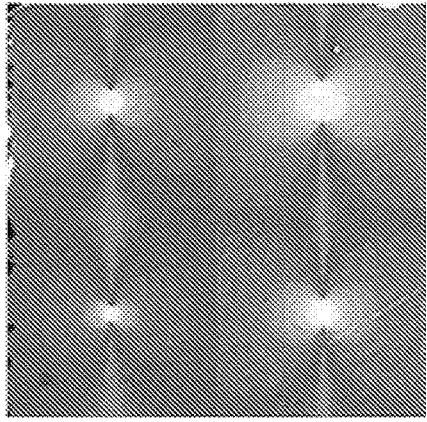
FIG. 25 illustrates the mask design, image of the fabricated mask with horizontal polarizer, image of the fabricated mask without polarizer, and image of the fabricated mask with vertical polarizer for an exemplary plasmonic metamask for a pair of ½ and 01/2 defects having the following parameters: length=150 nm; width=70 nm; height=80 nm; and periodicity=220 nm.
Figure 25:
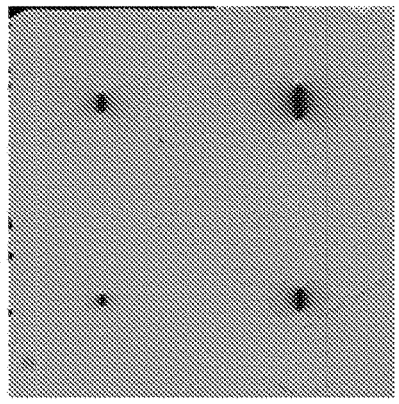
Figure 25:
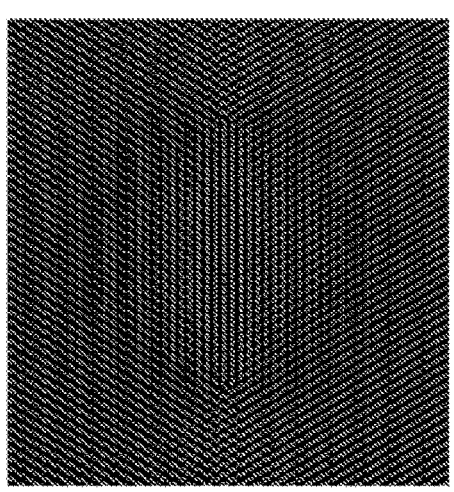
Figure 25:
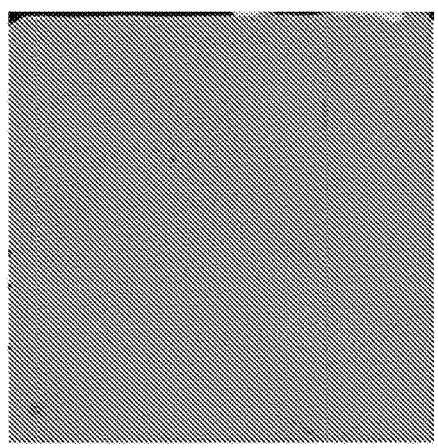

Plasmonic metamasks having nanocuboid elements with the following parameters were fabricated: length=150 nm; width=70 nm; height=80 nm; and periodicity=220 nm. FIG. 25 includes the mask design for the ½ defect pair; image of the fabricated mask under a polarizer with horizontal polarization; image of the fabricated mask without polarizer; and image of the fabricated mask under a polarizer with a vertical polarization direction.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. A method for aligning liquid crystals comprising:
transmitting light through or reflecting light by a metamask onto a substrate, wherein the metamask generates light with spatially variant patterns of polarization direction and intensity;
wherein the substrate comprises the liquid crystals;
wherein the metamask comprises an array of metallic nanocuboids on a metamask substrate;
wherein the metamask substrate is transparent to light of predetermined wavelengths; and
wherein the metallic nanocuboids are arranged in a triangular lattice.

2. The method of claim 1, wherein the liquid crystals are in contact with photoalignment materials during the transmitting of light.

3. The method of claim 1, wherein the liquid crystals are in contact with photoalignment materials after the transmitting of light.

4. The method of claim 1, wherein the metamask is a plasmonic metamask.

5. The method of claim 1, wherein the light transmitted through or reflected by the metamask has patterns of spatial variations in intensity and polarization direction.

6. The method of claim 1, wherein the metallic nanocuboids comprise a metallic material selected from the group consisting of elemental aluminum, an aluminum alloy, elemental copper, a copper alloy, elemental gold, a gold alloy, elemental silver, or a silver alloy.

7. The method of claim 1, wherein the lattice has a periodicity of from about 100 to about 500 nm.

8. The method of claim 1, wherein the metallic nanocuboids are arranged with spatially varying orientations.

9. The method of claim 1, wherein a photoalignment layer is present on a top surface of the substrate during the transmitting.

10. The method of claim 1, wherein the substrate further comprises a photoalignment material mixed with the liquid crystals.

11. The method of claim 1, wherein the metamask is located at a distance of from about 0 to about 50 times a wavelength of light provided to the substrate.

12. The method of claim 1, wherein a lens is positioned between the metamask and the photoalignment layer for projecting the metamask patterns onto the substrate.

13. The method of claim 1, wherein two objective lenses are positioned between the metamask and the photoalignment layer for projecting the metamask patterns onto the substrate.

14. A plasmonic metamask comprising an array of metallic nanocuboids on a metamask substrate; wherein the metamask substrate is transparent to light of predetermined wavelengths; and wherein the metallic nanocuboids are arranged in a triangular lattice.

15. The plasmonic metamask of claim 14, wherein the metallic nanocuboids comprise a metallic material selected from the group consisting of elemental aluminum, an aluminum alloy, elemental copper, a copper alloy, elemental gold, a gold alloy, elemental silver, or a silver alloy.

16. The plasmonic metamask of claim 14, wherein the nanocuboids are parallelepipeds.

17. The plasmonic metamask of claim 14, wherein the nanocuboids are cubic.

* * * * *